United States Patent
Hayashi et al.

(10) Patent No.: US 7,321,495 B2
(45) Date of Patent: Jan. 22, 2008

(54) CAPACITOR AND METHOD FOR MANUFACTURING THE SAME

(75) Inventors: Kazuhiro Hayashi, Aichi (JP); Jun Otsuka, Aichi (JP); Manabu Sato, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 11/003,784

(22) Filed: Dec. 6, 2004

(65) Prior Publication Data

US 2005/0121772 A1 Jun. 9, 2005

(30) Foreign Application Priority Data

Dec. 5, 2003 (JP) ............... 2003-407351

(51) Int. Cl.
 H01L 23/48 (2006.01)
 H01L 21/44 (2006.01)
(52) U.S. Cl. .................. 361/761; 257/700; 257/924; 257/532; 438/617; 438/957; 361/306.3; 361/303; 361/306.1; 29/25.42; 29/846
(58) Field of Classification Search ............ None
See application file for complete search history.

(56) References Cited

U.S. PATENT DOCUMENTS

| | | | |
|---|---|---|---|
| 5,177,670 | A | 1/1993 | Shinohara et al. |
| 6,034,864 | A | 3/2000 | Naito et al. |
| 6,370,011 | B1 | 4/2002 | Naito et al. |
| 6,370,013 | B1 | 4/2002 | Iino et al. |
| 6,462,932 | B1 | 10/2002 | Naito et al. |
| 6,496,354 | B2 | 12/2002 | Naito et al. |
| 6,496,355 | B1 | 12/2002 | Galvagni et al. |
| 6,549,395 | B1 | 4/2003 | Naito et al. |
| 6,795,295 | B2 * | 9/2004 | Murakami et al. ....... 361/306.3 |
| 2005/0122662 | A1 | 6/2005 | Hayashi et al. |

FOREIGN PATENT DOCUMENTS

| | | |
|---|---|---|
| EP | 0917165 A2 | 5/1999 |
| JP | 11-204372 A | 7/1999 |
| JP | 2002-359141 A | 12/2002 |
| JP | 2003-158030 A | 5/2003 |
| WO | WO 03/019656 A2 | 3/2003 |
| WO | WO 03/021614 A1 | 3/2003 |

* cited by examiner

*Primary Examiner*—Sue A. Purvis
*Assistant Examiner*—Fazli Erdem
(74) *Attorney, Agent, or Firm*—Sughrue Mion, PLLC

(57) ABSTRACT

A multilayer ceramic capacitor (10) having reduced inductance which is separated into a first layer body (11) and a second layer body (12). The first layer body (11) and the second layer body (12) are formed by alternately layering inner electrodes (inner electrode 13a, inner electrode 13b) so as to face each other and sandwich ceramic layers (14). The ceramic layers (14) of the second layer body (12) are thicker than the ceramic layers (14) of the first layer body (11), so as to compensate for electrode height difference. Moreover, in the second layer body (12), the inner electrodes (13b) are electrically connected by via electrode (15b) so that the part of the via electrode (15b) extending without connection to an inner electrode (13b) is shortened.

17 Claims, 11 Drawing Sheets

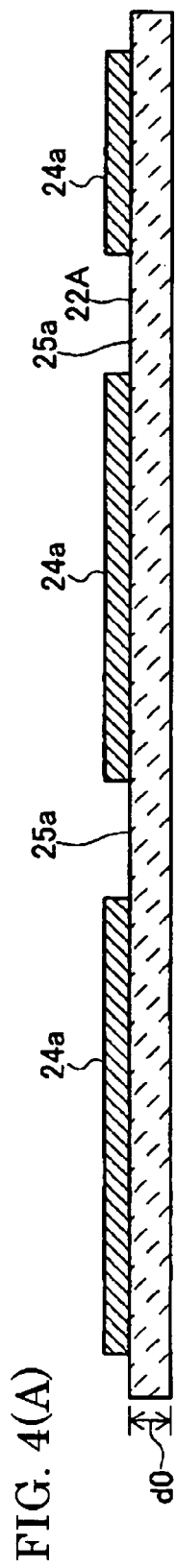
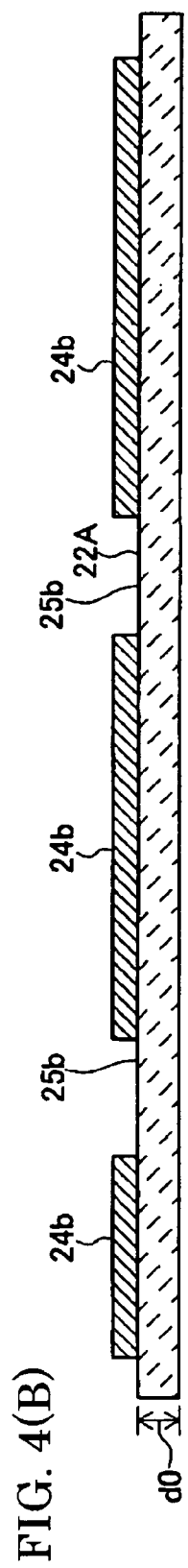
FIG. 4(A)
FIG. 4(B)

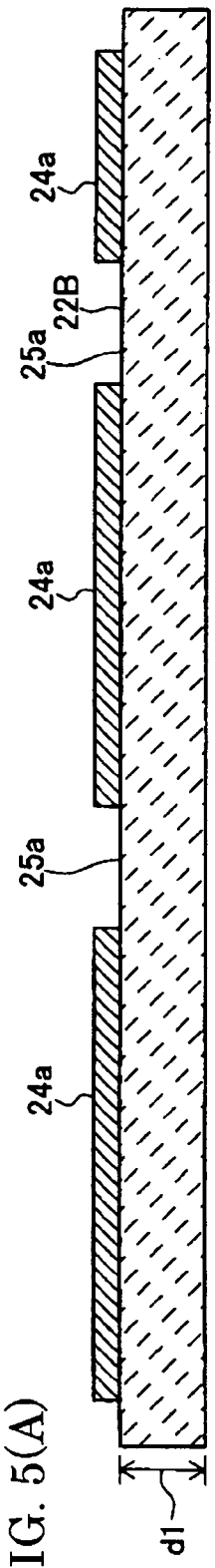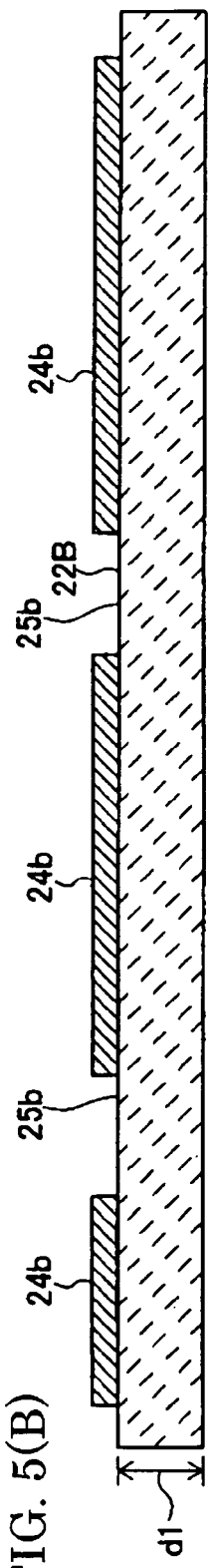

CAPACITOR AND METHOD FOR MANUFACTURING THE SAME

BACKGROUND OF THE INVENTION

1. Field of the Invention

The present invention relates to a capacitor in which a plurality of inner electrodes are alternately layered so as to face each other sandwiching dielectric layers and, more particularly, to a multilayer capacitor including a via electrode for passing current from a terminal electrode to the inner electrodes, and a method for manufacturing the capacitor.

2. Description of the Related Art

In a multilayer capacitor, an inner electrode is structured by a first electrode layer and a second electrode layer sandwiching dielectric layers, and a plurality of via electrodes are provided along the layer stacking direction to pass current among these electrode layers. See, for example, Patent Documents 1 and 2 below. The multilayer capacitor can be used as a decoupling capacitor, for example, to reduce the power noise of ICs.

[Patent Document 1] JP-A-2002-359141
[Patent Document 2] JP-A-2003-158030

For such applications, the capacitor requires a large capacitance and a low inductance-, and to achieve this, the inner electrodes have generally been multilayered and connected with columnar via electrodes formed penetrating in a direction normal to the planes of dielectric layers inside the capacitor so as to reduce inductance of the capacitor. On the dielectric layers there are portions where electrodes are formed and portions where electrodes are not formed. Therefore, when multiple layers of electrodes are formed in the dielectric layer, in the resulting capacitor the part where electrodes are formed and the part where no electrodes are formed have different thicknesses, thereby forming a step (electrode step) or rather causing an electrode height difference. To eliminate such an electrode step, the capacitor generally has on its surface layer a thick dielectric layer portion called a base layer that absorbs the electrode height difference.

PROBLEMS TO BE SOLVED BY THE INVENTION

With respect to the above-described conventional capacitor, the following problems have been identified.

With the multilayer capacitor having the via electrode described above, the via electrode passes through the base layer to establish continuity with the inner electrodes below the base layer. In such structure, there is a portion of the via electrode which does not contact the inner electrodes, the length of which is the thickness of the base layer.

In recent years, due to the increased speed of ICs, there is a need for decoupling capacitors having ever lower inductance. However, inductance is increased due to the long portion of the via electrode that does not contact the inner electrodes. The thicker the base layer, the higher the inductance will be, and this makes it difficult to improve the electrical characteristics of the multilayer capacitor. Especially in the higher frequency range, the influence of added length is considerable. Although this problem can be mitigated by reducing the thickness of the base layer, the thickness reduction of the base layer is limited by the electrode step. Thus, thickness reduction of the base layer is not a practical solution.

SUMMARY OF THE INVENTION

The present invention has been achieved to solve the above-described problems of the prior art, and an object thereof is to eliminate both the electrode step and reduce inductance of a multilayer capacitor having a plurality of stacked inner electrodes.

The above object of the present invention has been achieved by providing a capacitor comprising an electrode layer section and a dielectric layer section, the electrode layer section comprising a plurality of positive and negative inner electrode layers facing each other and sandwiching dielectric layers. The dielectric layer section is provided over the electrode layer section at an upper surface layer side of the capacitor. In the electrode layer section, a plurality of inner electrodes are layered together so as to face each other sandwiching dielectric layers, and in the dielectric layer section, plural dielectric layers are overlaid between electrode layers. Then, by using via electrodes formed in a direction normal to the planes along which the inner electrodes are layered, each via electrode connecting the electrodes of the same polarity, current is passed among the inner electrodes in the electrode layer section.

In addition to adopting such a structure, in the capacitor of the present invention, the dielectric layer section is provided with inner electrodes facing each other and sandwiching a dielectric layer, and the space between the inner electrodes in the dielectric layer section is made wider than the space between the inner electrodes in the electrode layer section. Moreover, the via electrode is structured so as to pass current among the inner electrodes in the dielectric layer. In other words, the capacitor according to the invention has one or more thicker dielectric layers (14b) and one or more thinner dielectric layers (14a), each dielectric layer sandwiched by the inner electrodes, and has columnar via electrodes penetrating the dielectric layers and connecting the inner electrodes of the same polarity, as shown in FIGS. 1, 8, 9 and 11. In an aspect of the invention, thicker dielectric layers are located closer to a top surface of the multilayer capacitor than to a bottom surface thereof.

Accordingly, in the capacitor of the present invention, the dielectric layer provided at an upper surface layer side of the capacitor serves as a flat base layer. That is, the dielectric layer has the effect of absorbing the electrode height difference due to its thickness. Moreover, by establishing continuity between the via electrode and the inner electrodes, the part of the via electrode that is not connected with inner electrodes can be designed shorter. As a result, in the capacitor of the present invention, the inductance can be reduced while absorbing the electrode height difference that is caused when plural inner electrodes are layered.

The capacitor of the present invention having the above structure can assume various embodiments, and as an example, the space between the inner electrodes in the dielectric layer section is preferably set to be twice to 20 times (more preferably 3 to 8 times) the space between the inner electrodes in the electrode layer section. Such an embodiment is considered preferable in view of achieving lower inductance and low electrode height difference. This is because the dielectric layers in the dielectric layer section need not be unnecessarily thick, that is, the part of the via electrode that is not connected with inner electrodes need not be unnecessarily long.

As another embodiment, a terminal connected to the via electrode may be formed on the surface of the dielectric layer section for each via electrode. Such a structure allows for easy connection of the lead to the via electrode via the terminal, and easy connection among packaging components. Alternatively, on the surface of the electrode layer section facing the dielectric layer section, a terminal connected to the via electrode may be formed.

Another means of solving the above-described problems is a capacitor including an electrode layer section structured by layering a plurality of inner electrodes facing each other and sandwiching dielectric layers, and using a via electrode formed in a direction normal to the planes along which the inner electrodes are layered, current is passed among the inner electrodes. In such a capacitor, a dielectric layer section is provided at the upper surface layer side of the capacitor in which plural dielectric layers are overlaid between electrode layers, and which includes a conductor layer section disposed toward the upper surface layer side of the capacitor, and a thick portion disposed below the conductor layer and toward the electrode layer section.

According to the present invention, the conductor layer section can reduce the inductance caused by the via electrode, and the thick portion can absorb the electrode height difference. Especially, at the upper surface side of the capacitor (i.e., the side closer to the packaged IC), in view of the fact that the entire inductance is considerably affected by the length of the part of the via electrode that is not connected with a conductor layer (e.g., inner electrodes), the conductor layer section in the dielectric layer section is structured so as to be located toward the upper surface layer side of the capacitor.

The conductor layer section includes a capacitor portion that is formed so that the inner electrodes face each other and sandwich part of the dielectric layer, and the via electrode preferably also passes current to the inner electrodes in the conductor layer section. When operation of a semiconductor element (IC) results in a voltage reduction due to simultaneous switching among elements, power comes first from the capacitor portion of the dielectric layer section located closer to the IC. The capacitor portion supplies power at higher speed due to its low-inductance characteristics, and functions effectively in the initial period of voltage reduction even if its capacity is small. Thereafter, the power is supplied by the electrode layer section which has a large capacity, and thus the noise caused by voltage reduction can be effectively suppressed. That is, by employing the above-described multilayer capacitor, effective decoupling can be executed.

The thickness of the capacitor portion of the conductor layer section is preferably 20% or less of the thickness of the entire capacitor, and more preferably, 10% or less. Moreover, it is preferably half or less the thickness of the electrode layer section, and more preferably, 25% or less. The capacitance of the capacitor portion of the conductor layer section is preferably half or less of the capacitance of the electrode layer section, and preferably 25% or less. Herein, the entire thickness of the capacitor and the thickness of the capacitor portion refer to the thickness in the direction of stacking of layers in the capacitor, and the thickness of the layer body denotes the thickness in the direction of stacking of layers in the layer body.

In the conductor layer section, the space between the capacitor upper surface and the inner electrode closest to the capacitor upper surface (in other words, the thickness of the capacitor portion subtracted from the conductor layer section) is so set as to be equal to or narrower than the thickness of the capacitor portion in the conductor layer section.

The thickness of the thick portion is preferably greater than the thickness of the conductor layer section. Moreover, the thickness of the thick portion is preferably set to be equal to ⅓ the thickness of the electrode layer section or thinner. Herein, the thick portion comprises at least a dielectric layer thicker than the dielectric layer in the electrode layer section.

Preferably, the via electrode comprises a first via electrode and a second via electrode, and is formed so as to pass from the side of the dielectric layer section through a first electrode layer and a second electrode layer of the inner electrode in the electrode layer section. The via electrode can be regarded as a penetrating via electrode that passes through both the conductor layer section and the electrode layer section. Such a structure is considered effective in terms of inductance reduction due to the mutual cancellation of the magnetic fields of the via electrodes. Moreover, in a multilayer ceramic capacitor whose via electrodes are virtually all penetrating via electrodes (half or more of all the via electrodes), such a structure is considered effective to a greater degree.

Other than an embodiment in which the capacitor alone is provided, the above-described capacitor of the present invention can include an installed electric device. Possible embodiments include a semiconductor-element-equipped capacitor in which a semiconductor element is connected by the dielectric layer section to pass current from the via electrode in the above-described capacitor, a wiring-board-integrated capacitor in which a connection is established with a wiring board, on a side of the dielectric layer section, which wiring includes a power line and a ground line, so as to pass current to the via electrode in the above-described capacitor, a substrate-integral-type capacitor in which a connection is established with a substrate on which wiring is present including a power line and a ground line on the surface side of the electrode layer section that is placed opposite the dielectric layer section to establish continuity with the via electrode in the above-described capacitor, an embodiment in which a semiconductor and a substrate are provided on the top and bottom surfaces of the capacitor, respectively, and others.

Moreover, a first procedure of the present invention adapted for manufacturing the above-described capacitor is a method of manufacturing a capacitor including an electrode layer section structured by layering a plurality of inner electrodes facing each other and sandwiching dielectric layers, a dielectric layer section structured by layering plural dielectric layers over the electrode layer section, and a via electrode formed in a direction normal to the planes along which the inner electrodes are layered for establishing continuity among the inner electrodes. Aspects of the method include:

a step (1) of alternately layering, to form the inner electrodes, an inner electrode formation material for a first electrode layer and a second electrode layer opposing the first electrode layer with a dielectric material for the dielectric layer interposed therebetween, and layering two layer bodies for integration into a single unit including: a first layer body serving as the electrode layer section; and a second layer body serving as the dielectric layer section formed by layering another inner electrode formation material for a third electrode layer and a fourth electrode layer facing the third electrode layer and sandwiching dielectric material for the dielectric layer having a thickness wider than the space between the inner electrodes in the first layer body; and a step (2) of forming, in the first layer body and the second layer body formed into a single unit, a through hole passing through all the first electrode layers layered in the first layered body and the third electrode layer in the second layer body, and a through hole passing through all the second electrode layers in the first layer body and the fourth electrode layer in the second layer body, and filling each of the through holes with a conductive paste.

In such case, the step (1) may include a step (1a) of forming either the first layer body or the second layer body, and a step (1b) of integrating the first layer body and the second layer body by forming the not-yet-formed layer body for layering with the previously formed (i.e., already-formed) layer body.

In the above-described step (1b), to form the not-yet-formed layer body for layering with the already-formed layer body, the dielectric material for forming the not-yet-formed layer body can be sequentially layered on the already-formed layer body. Herein, if the not-yet-formed layer body is the second layer body serving as the dielectric layer section, it is easy to layer plural sheets of thick dielectric material as a result of forming the third electrode layer and the fourth electrode layer using the inner electrode formation material on the previously-formed layer body (first layer body).

Further, a second procedure of the present invention adapted for manufacturing the above-described capacitor is a method of manufacturing a capacitor including an electrode layer section structured by layering a plurality of inner electrodes facing each other and sandwiching dielectric layers, and a dielectric layer section structured by layering plural dielectric layers over the electrode layer, and a via electrode formed in a direction normal to the planes along which the inner electrodes are layered for establishing continuity among the inner electrodes. Aspects of the method include:

a step (1) of forming either a first layer body serving as the electrode layer section or a second layer body serving as the dielectric layer section; and a step (2) of integrating the first layer body and the second layer body by forming the not-yet-formed layer body for layering on the already-formed layer body, wherein the first layer body is formed by alternately layering an inner electrode formation material for a first electrode layer and a second electrode layer facing the first electrode layer and sandwiching a dielectric material for the dielectric layer, and in the resulting layer body, by filling a conductive paste into a first layer body through hole formed to pass respectively through the first electrode layers and the second electrode layers, the second layer body is formed by layering another inner electrode formation material for a third electrode layer and a fourth electrode layer sandwiching dielectric material forming a dielectric layer having a thickness wider than the space between the inner electrodes in the first layer body, by forming second layer body through holes to pass respectively through the third electrode layer and through the fourth electrode layer, by overlaying the second layer through hole passing through the third electrode layer on the first layer through hole passing through the first electrode layer in the first layer body, and by overlaying the second layer body through hole passing through the fourth electrode layer on the first layer body through hole passing through the second electrode layer in the first layer body, and by filling a conductive paste into the second layer body through hole, and the step (2) includes a step of, to form the not-yet-formed layer body for layering with the already-formed layer body, sequentially layering the dielectric material for forming the not-yet-formed layer body on the previously-formed layer body with the not-yet formed layer body through hole filled with the conductive paste.

Still further, a third procedure of the present invention adapted for manufacturing the above-described capacitor is a method of manufacturing a capacitor including an electrode layer section constructed by layering a plurality of inner electrodes facing each other and sandwiching dielectric layers, and a dielectric layer section constructed by layering plural dielectric layers to be laid over the electrode layer section and electrically connecting the inner electrodes using a via electrode formed in a direction normal to the planes along which the inner electrodes are layered. Aspects of the method include:

a step (1) of forming a first layer body serving as the electrode layer section and a second layer body serving as the dielectric layer section; and a step (2) of integrating the first and second layer bodies, wherein in the first layer body formed in the step (1), an inner electrode formation material for a first electrode layer and a second electrode layer facing the first electrode layer are alternately layered while sandwiching dielectric material for the dielectric layer, and first layer body through holes are formed to pass respectively through the first electrode layers and through the second electrode layers in the resulting layer body, in the second layer body formed in the step (1), another inner electrode formation material for a third electrode layer and a fourth electrode layer to form the inner electrode is layered sandwiching the dielectric material forming a dielectric layer having a thickness wider than the space between the inner electrodes in the first layer body, and second layer body through holes are formed to pass respectively through the third electrode layer and through the fourth electrode layer in the resulting layer body, the second layer through hole passing through the third electrode layer is overlaid with the first layer through hole passing through the first electrode layer in the first layer body, and the second layer body through hole passing through the fourth electrode layer is overlaid with the first layer body through hole passing through the second electrode layer in the first layer body, and in the step (2), to integrate the first and second layer bodies, the second layer body through hole passing through the third electrode layer in the second layer body is overlaid with the first layer body through hole passing through the first electrode layer in the first layer body, and the second layer through hole passing through the fourth electrode layer is overlaid with the first layer through hole passing through the second electrode layer in the first layer body.

In the above-described second and third procedures, to form the second layer body serving as the dielectric layer section, it is easy to layer plural sheets of thick dielectric material as a result of forming the third electrode layer and the fourth electrode layer using the inner electrode formation material.

By carrying out such processes, a capacitor can be manufactured with ease in which the electrode height difference can be absorbed, and at the same time, the inductance can be reduced by shortening the part of a via electrode not establishing continuity with inner electrodes.

BRIEF DESCRIPTION OF THE DRAWINGS

FIG. 4 is a diagram illustrating a process of FIG. 3 for manufacturing the first layer body 11.

FIG. 5 is a diagram illustrating a process of FIG. 3 for manufacturing the second layer body 12.

DESCRIPTION OF REFERENCE NUMBERS

Figure 1:
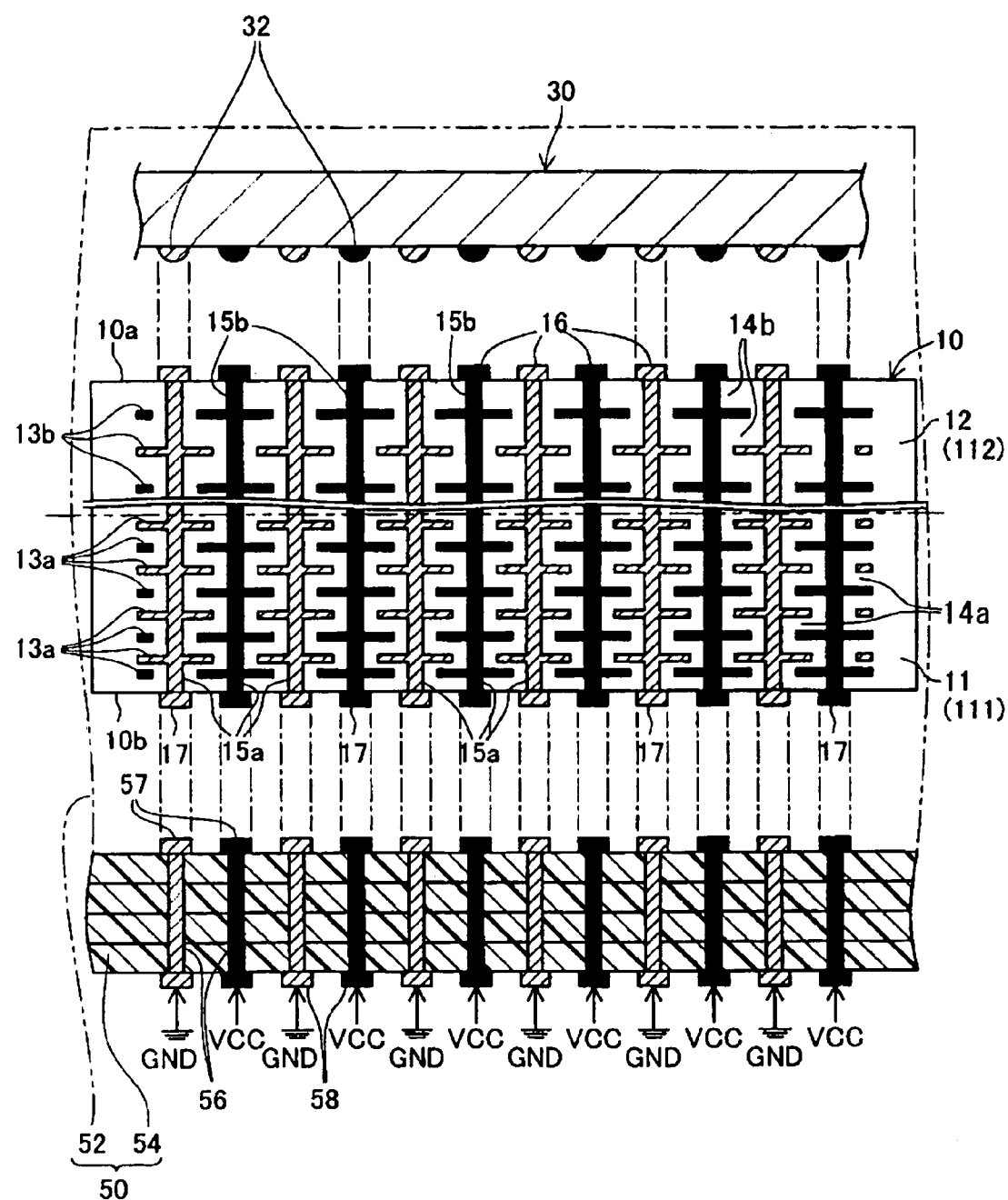
FIG. 1 is a vertical cross sectional view of an example arrangement of a multilayer ceramic capacitor 10 of the present invention.

Reference numbers used to identify various structural features in the appended drawings include the following.

10 . . . multilayer ceramic capacitor
10a . . . top surface
10b . . . bottom surface
11 . . . first layer body
12 . . . second layer body
13a . . . inner electrode
13b . . . inner electrode
14a, 14b . . . ceramic dielectric layer
15a . . . via electrode
15b . . . via electrode
16 . . . top-side terminal
17 . . . bottom-side terminal
20a . . . window section
20b . . . window section
22A . . . ceramic green sheet
22B . . . ceramic green sheet
24 (24a, 24b) . . . inner electrode layer
25 (25a, 25b) . . . window section
25A . . . window section vertical region
25B . . . window section peripheral region
26 . . . through hole
27 . . . peeling sheet
28 . . . cover layer
29 . . . cover sheet
32 . . . pad
50 . . . package
52 . . . upper layer
54 . . . lower layer
56 . . . lead
57 . . . bump
58 . . . terminal
60 . . . wiring board
66 . . . lead
67 . . . terminal
100 . . . sheet layer body
150 . . . laser beams

DETAILED DESCRIPTION OF THE INVENTION

The present invention is described in greater detail below by reference to the drawings. However, the present invention should not be construed as being limited thereto.

A. EXAMPLE

A-1. Structure of Multilayer Ceramic Capacitor 10:

FIG. 1 is an illustration diagram showing, by a vertical cross sectional view, a multilayer ceramic condenser 10 of the present invention. In the exemplary arrangement shown in FIG. 1, an IC chip 30 and a package 50 are connected to each other via the multilayer ceramic condenser 10.

The IC chip 30 is a chip formed on a silicon substrate (wafer) including a plurality of circuit elements including transistors, resistors, and the like. The circuit elements are connected to one another through a plurality of aluminum wiring configurations. The aluminum wiring configurations thus connected to the circuit elements extend to the lower surface of the IC chip 30, and are connected to a bump-shaped pad 32. The pads 32 are arranged in a lattice on the lower surface of the IC chip 30 corresponding to the extended portions of the aluminum wiring configurations.

The package 50 carries the IC chip 30 with the multilayer ceramic capacitor 10 interposed therebetween. As an insulation layer, a lower layer 54 is provided for placement of the multilayer ceramic capacitor 10. In the present example, the lower layer 54 is formed from an epoxy resin. It is also possible to form the lower layer 54 using other insulation materials (e.g., resin materials in addition to epoxy resin, or ceramic). In addition to lower layer 54, the IC chip 30 may have an upper layer 52 that is provided as an insulation layer to cover the IC chip 30 on the lower layer 54 together with the multilayer ceramic capacitor 10 (refer to the chain double-dashed lines in FIG. 1). Using such structure, the IC chip 30 may be encapsulated in the insulation layer, thereby effectively protecting the IC chip 30 from the external environment.

The lower layer 54 is formed by layering rectangular-shaped plate bodies made of epoxy resin. A lead 56 made of a copper-plated layer or a copper foil is used to establish continuity among the lower layers 54. The lead 56 is provided with a bump 57 exposed at the upper plane of the lower layer 54 (plane locating at the upper side of FIG. 1), and a terminal 58 exposed at the lower plane of the lower layer 54 (plane locating at the lower side of FIG. 1). The bumps 57 are terminals connected to the multilayer ceramic condenser 10 described below, and are arranged in a lattice on the upper plane of the lower layer 54. A solder connection is established from the terminal 58 to the wiring configurations including a power line or a ground line. In FIG. 1, the lead 56, the bump 57, and the terminal 58 all electrically connected as a power line are solidly shaded in black, and the lead 56 serving as a ground line is hatched. Leads for use as signal lines are not shown.

The multilayer ceramic capacitor 10 is separated into an upper part and a lower part by the chain double-dashed lines shown in the drawing, and the lower part is denoted as a first layer body 11, and the upper part is denoted as a second layer body 12. The chain double-dashed lines in the drawing are not rendered at positions reflecting the thickness of the first layer body 11 and the second layer body 12. Rather, these lines are provided to separate, for the sake of convenience, the multilayer ceramic capacitor 10 into the above-described first layer body 11 and second layer body 12.

The first layer body 11 is located at the lower side of the capacitor shown in the drawing (bottom surface side of the condenser), and has a structure in which inner electrodes 13a are layered, a ceramic layer 14 is provided between the electrodes to serve as a dielectric body, and the inner electrodes 13a are layered alternately facing each other and sandwiching the ceramic layer 14 (such structure is referred to below as a multilayer structure). Thus, the first layer body 11 serves as an electrode layer section, and the inner electrodes 13a facing each other serve as a first electrode layer and a second electrode layer. Moreover, the second layer body 12 is located at the upper side of the capacitor (top side of the capacitor), and has a multilayer structure in which other inner electrodes 13b are layered alternately to face other and sandwich ceramic layers 14. Further, the ceramic layer 14 is also interposed between the inner electrodes 13a at the top layer of the first layer body 11 and the inner electrodes 13b at the bottom layer of the second layer body 12.

The inner electrodes 13a in the first layer body 11 are formed in predetermined repeated patterns, to include the solidly-shaded first electrode layers and the hatched second electrode layers alternately arranged so as to oppose one another. Electrical continuity of inner electrodes 13a with first and second via electrodes 15a is established for each of the first and second electrode layers, respectively, and the via electrodes 15a are connected to power supplies, circuits, or other external components through bottom-side terminals 17.

The inner electrodes 13b in the second layer body 12 are also formed in other predetermined repeated patterns (second repeated patterns) to include the solidly-shaded first electrode layers and the hatched second electrode layers alternately arranged so as to oppose one another. Electrical continuity of inner electrodes 13b with first and second via electrodes 15b is established for each of the first and second electrode layers, respectively, and the via electrodes 15b are connected to power supplies, circuits, or other external components through top-side terminals 16.

The via electrodes 15a and 15b of the first layer body 11 and the second layer body 12 are placed in a row, and are formed toward a bottom surface 10b from a top surface 10a of the multilayer ceramic condenser 10.

As shown in the drawing, the ceramic layer 14 interposed between the electrode layers in the first layer body 11 differs from that in the second layer body 12. In the second layer body 12, the thickness of the ceramic layer 14 is set to 10 to 100 μm, which is about twice to 20 times the thickness (about 5 μm) of the ceramic layer 14 in the first layer body 11. Thus, the second layer body 12 overlays the first layer body 11 (electrode layer section) on the top surface side of the capacitor, the ceramic layer 14 of the second layer body 12 is thicker than that of the first layer body 11, and the space between the inner electrodes in the second layer body 12 is greater than the space between the inner electrodes in the first layer body 11. Thus, the second layer body 12 serves as the dielectric layer section of this embodiment, and the inner electrodes 13b serve as the third electrode and fourth electrode layers in this embodiment. Further, as to the second layer body 12, the electrode layers are less in number compared with the first layer body 11, and the entire thickness of the second layer body 12 is in the neighborhood of about 5 to 20% of the entire thickness of the multilayer ceramic capacitor 10. For example, in the present embodiment, the multilayer ceramic capacitor 10 has a thickness of 1 mm, and the second layer body 12 has a thickness of about 125 μm. Then, the second layer body 12 is structured to be 5-layer body, i.e., 4-layered inner electrodes 13b including a ceramic layer 14 having a thickness of 25 μm interposed between the inner electrodes 13b. If this case, the thickness of the first layer body 11 is equal to the remaining thickness of the second layer body 12. Even if the multilayer ceramic capacitor 10 is made thinner, the first layer body 11 preferably has a thickness equal to or thicker than 400 μm in view of providing increased capacity.

The inner electrodes 13a and 13b, and the via electrodes 15a and 15b will next be described. Herein, the inner electrodes 13a and the inner electrodes 13b may be arranged in the same or different patterns. Considering that the via electrodes 15a and 15b are both formed with the same pitch, and in the case where the inner electrodes share the same pattern, the first layer body 11 is exemplified below. FIG. 2 is a diagram illustrating how the inner electrode 13a and the via electrode 15a are formed in the first layer body 11.

Figure 2A:
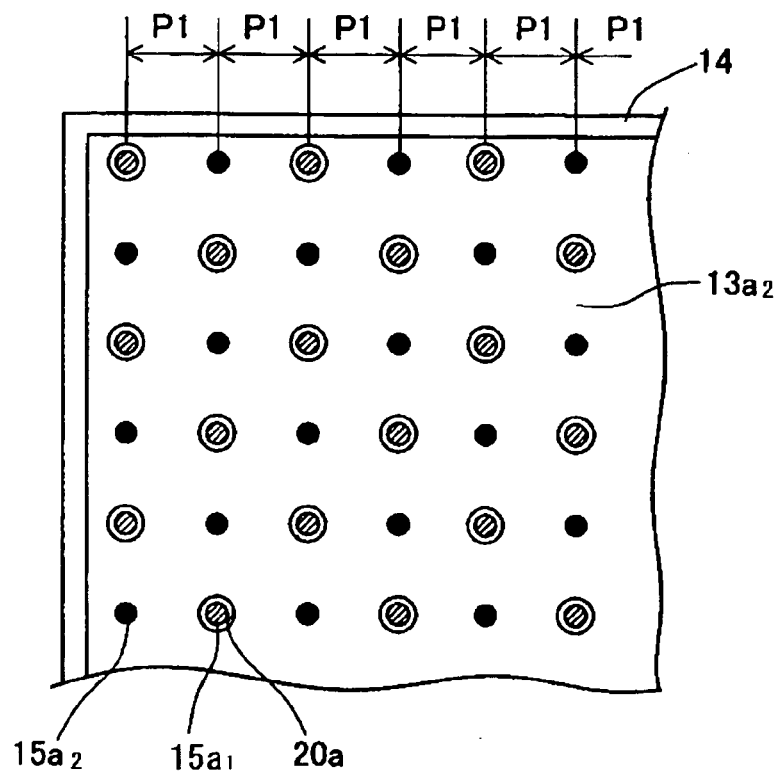
FIGS. 2(A) and (B) are horizontal sectional views of first and second inner electrode layers 13a and first and second via electrodes 15a, respectively, formed in a first layer body 11.

As shown in FIG. 2(A), the first inner electrode 13a is connected to the solidly-shaded first via electrode 15a passing therethrough, and is electrically insulated from the hatched second via electrode 15a by a window section 20a disposed around the part through which the hatched via electrode traverses. The solidly-shaded first via electrode 15a and the hatched second via electrode 15a are formed repeatedly with a predetermined pitch P1.

Figure 2B:
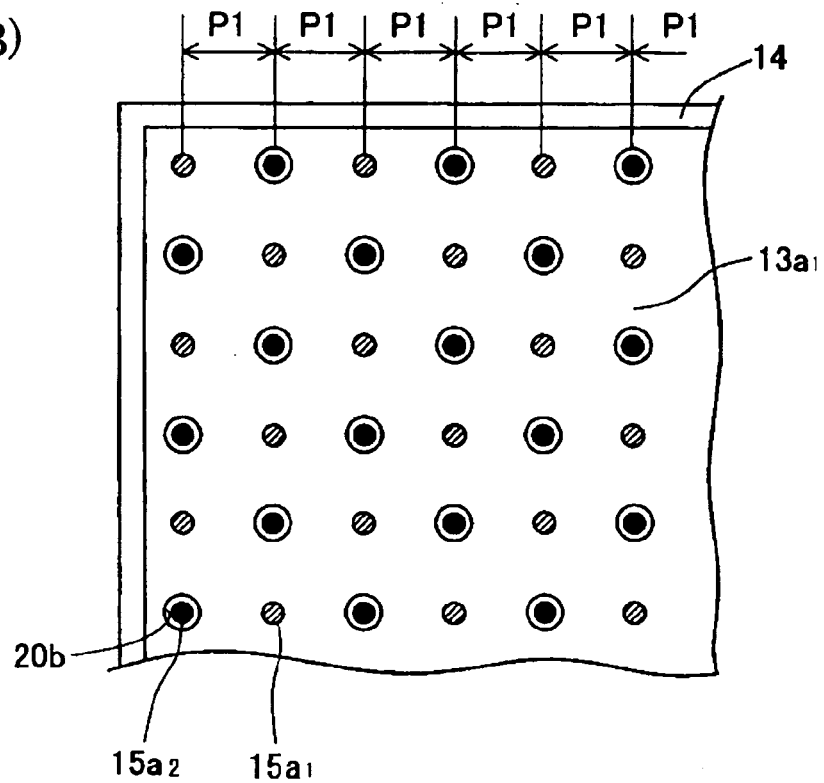

Moreover, as shown in FIG. 2(B), the second inner electrode 13a shown in the drawing is penetrated by the second hatched via electrode 15a so that an electrical connection is established with the second via electrode 15a, and electrically insulated from the blackened first via electrode 15a by a window section 20b disposed around the part through which the blackened first via electrode traverses.

In the regions of the window sections 20a and 20b, the inner electrodes do not face each other. Rather, the layered inner electrodes 13a are overlaid so as to face each other in areas other than the window sections 20a and 20b.

In the second layer body 12, if it shares the same pattern as the first layer body 11, similarly to the above, the ceramic layer 14 set together with the inner electrodes and via electrode has a different thickness than in the first layer body 11. The inner electrode pattern, the via electrode pitch, and the like are the same as those of the first layer body 11. Cases where the second layer body 12 has a pattern different from that of the first layer body 11, include the case where the window sections 20a and 20b shown in FIG. 2 are both made larger. In the second layer body 12 having the greater space between the inner electrodes, reducing the size of the window sections 20a and 20b as such does not contribute much to increased capacitance. Thus, increasing the size of the window sections is considered effective in preventing contact between the inner electrodes and the via electrodes.

The multilayer ceramic capacitor 10 of the present example is provided with inner electrodes 13a and inner electrodes 13b in the dielectric body, and those inner electrodes which face one another function as a capacitor. That is, through an electrical connection established between the first and second inner electrodes 13a and the first and second via electrodes 15a, respectively, and through an electrical connection established between the first and second inner electrodes 13b and the first and second via electrodes 15b, respectively, the opposing first and second electrode layers thus connected function as a multilayer capacitor. The above structure of the multilayer ceramic capacitor 10 provides a large capacitance in a small-sized package.

A-2. Process of Manufacturing Multilayer Ceramic Capacitor 10

Figure 3:
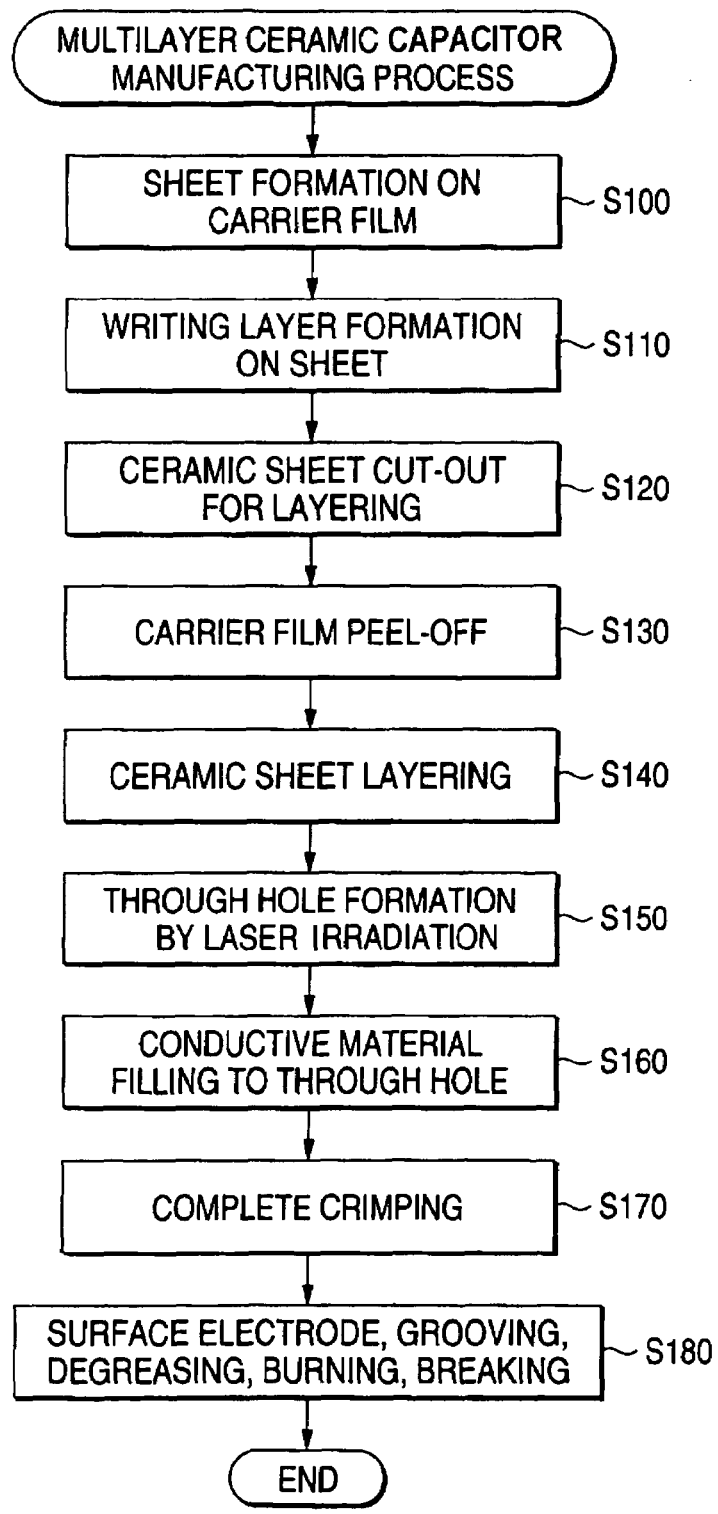
FIG. 3 is a diagram showing a process for manufacturing the multilayer ceramic capacitor 10.

The multilayer ceramic capacitor 10 of the above structure can be manufactured by the following method. FIG. 3 is a diagram showing a process for manufacturing the multilayer ceramic capacitor 10, FIG. 4 is a diagram showing how the process of FIG. 3 is executed for the first layer body 11, and FIG. 5 is a diagram showing how the process of FIG. 3 is executed for the second layer body 12. The multilayer ceramic capacitor 10 is manufactured by carrying out the processes of steps S100 to S180 of FIG. 3. The details of these processes will next be described, in order of steps.

(2)-1 Sheet Formation on Carrier Film (step S100)

First, a long-length carrier film such as a PET (polyethylene terephthalate) film is evenly coated with a thin ceramic slurry composed of barium titanate ($BaTiO_3$) or other materials, and the resulting film is then dried. As a result, the carrier film is formed with a ceramic green sheet 22A thereon. After baking, this ceramic green sheet 22A becomes the ceramic layer 14 serving as a dielectric layer for the first layer body 11, and serves as the dielectric material in this embodiment.

As to the second layer body 12, while applying the same technique, a ceramic green sheet 22B is formed on another carrier film on a production line different from that used for fabricating the first layer body 11. As shown in FIGS. 4 and 5, the ceramic green sheet 22A of the first layer body 11 and the ceramic green sheet 22B of the second layer body 12 have different thicknesses, the thickness of the ceramic green sheet 22B being five times that of the ceramic green sheet 22A. After baking, this ceramic green sheet 22B becomes the ceramic layer 14 serving as a dielectric layer in the second layer body 12, and serves as the dielectric material in this embodiment.

(2)-2 Electrode Layer Formation on Sheet (step S110)

Next, to the dried ceramic green sheets 22A and 22B, an Ag—Pd electrode pattern is printed by screen printing or other technique. As a result, on the surfaces of the ceramic green sheets 22A and 22B are formed respective inner electrode layers 24 (24a and 24b), at the parts for electrodes in the printing pattern (refer to FIGS. 4 and 5). Moreover, the ceramic green sheets 22A and 22B are provided with, on their respective surfaces, window sections 25 (25a and 25b) where electrodes are not printed. In this example, the inner electrode layer 24 has a thickness of 2 to 3 μm, the ceramic green sheet 22A has a thickness of 6 μm, and the ceramic green sheet 22B has a thickness of 30 μm. The thus formed inner electrode layers 24 (24a and 24b) become, after baking, the inner electrodes 13a and 13b in the first layer body 11 and the second layer body 12. Thus, the electrode pattern which has been printed (Ag—Pd electrode pattern of) becomes the inner electrode formation material in this embodiment. Moreover, the ceramic green sheets 22A and 22B are formed with the same electrode patterns 24a and 24b on their respective surfaces. Alternatively, the electrode patterns to be formed on the ceramic green sheets 22A and 22B are not necessarily the same, by changing the size of the window section, for example, as described above.

(2)-3 Cutting out portions of Multilayer Ceramic Sheet, and Peeling off Carrier Film (steps S120 and S130)

Next, while moving the long-length carrier film on which are formed the above-described ceramic green sheets 22A and 22B, the ceramic green sheets 22A and 22B are cut out in a given shape together with the inner electrode layer 24 on the surface of the ceramic green sheet, for example. The carrier film is peeled off from the thus cut-out ceramic green sheets 22A and 22B, for example, by winding up the carrier film. To cut out the ceramic green sheets 22A and 22B, two types of the ceramic green sheets 22A and 22B varying in layout of the inner electrode layers 24 and the window sections 25 are cut out, as shown in FIGS. 4 and 5. FIG. 4(A) and FIG. 5(A) correspond to the cross sectional view of FIG. 2(A), and FIG. 4(B) and FIG. 5(B) correspond to the cross sectional view of FIG. 2(B).

(2)-4 Layering of Ceramic Sheet (Step S140)

Figure 6:
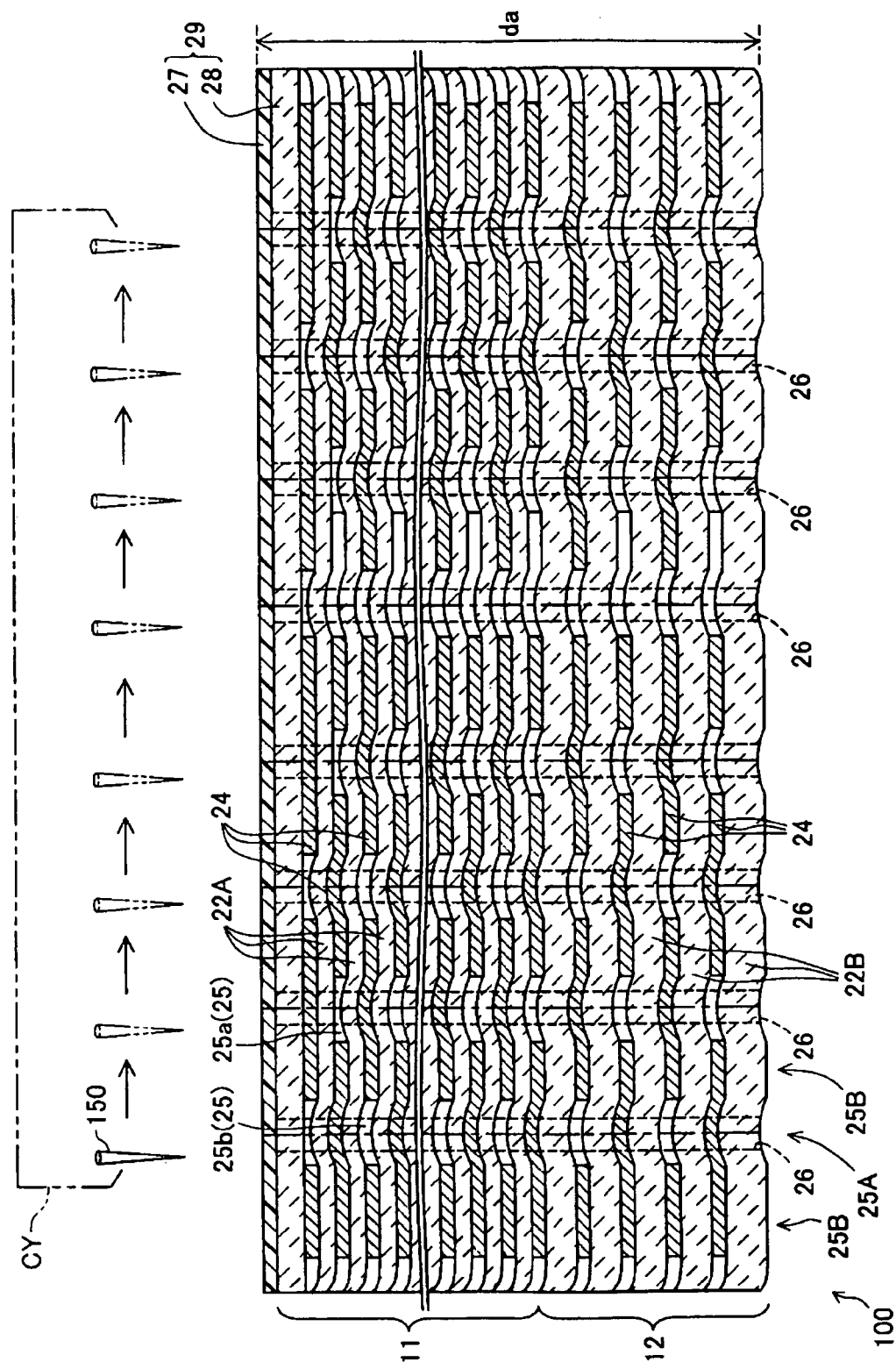
FIG. 6 is a diagram schematically showing a state after completion of sheet layering, and illustrating laser irradiation for forming through holes 26.

FIG. 6 is a diagram schematically showing the state once the sheet layering is completed, and how laser irradiation is carried out in steps as described below. Next, a predetermined number of ceramic green sheets 22A and 22B formed as above are layered. At the time of layering, a cover sheet 29 is first laid. As shown in FIG. 6, this cover sheet 29 includes a cover layer 28 that is formed by thickly coating a ceramic slurry on a peeling sheet 27 made of PET (polyethylene terephthalate), and then drying. This cover layer 28 is set to have almost the same thickness as the ceramic green sheet 22B.

Thereafter, on the cover layer 28 of thus laid cover sheet 29, a predetermined number of the two types of ceramic green sheets 22A shown in FIGS. 4(A) and (B) are layered alternately as shown in FIG. 6. At the time of layering, as shown in the drawings, the inner electrode 24 of the ceramic green sheet 22A at the bottom (at the top in the drawing) is placed so as to contact the cover layer 28, and then, the inner electrode 24 of the next ceramic green sheet 22A is layered over the already-layered ceramic green sheet 22A.

After the ceramic green sheets 22A are layered, a predetermined number of ceramic green sheets 22B are layered on the already-layered ceramic green sheets 22A (five are shown in the drawing). At the time of layering, over the already-layered ceramic green sheets 22A are laid ceramic green sheet 22B so that its inner electrodes 24 contact a ceramic green sheet 22A, and thereafter, the ceramic green sheets 22B are layered in the same manner. By layering a predetermined number of the ceramic green sheets 22B, a ceramic layer body 100 is completed.

To form such a sheet layer body 100 in which the first layer body 11 and the second layer body 12 are layered as described above, the first layer body 11 is first formed by layering, and then the second layer body 12 is formed by sequentially layering the ceramic green sheets 22B. As an alternative method, the following will suffice: the first layer body 11 and the second layer body 12 are both formed in advance by layering the corresponding ceramic green sheets, and the resulting layer bodies are put together. In another possible method, in reverse order, the second layer body 12 may first be formed by layering, and the ceramic green sheet 22A may be layered thereon so that the first layer body 11 is formed on the second layer body 12.

The entire thickness da of the sheet layer body 100 including the cover sheet 29 determines the thickness of the multilayer ceramic capacitor 10 in its finished form. The thickness da is defined by the thicknesses d0 and d1 of the ceramic green sheets 22A and 22B, respectively (refer to FIGS. 4 and 5), their number of layers in total, and the thickness of the cover layer 28, which are each determined depending on the desired specifications and size of the multilayer ceramic capacitor 10. In the present embodiment, assuming that a capacitor structure after baking has a thickness of 1 mm, the entire thickness da of the ceramic layer body is set to be 1.2 mm. Because the above-described ceramic green sheets 22A and 22B each serves as the ceramic layers 14 for the first layer body 11 and the second layer body 12 after baking, the thicknesses d0 and d1 of these ceramic green sheets determine the space between the inner electrodes 13a and the space between the inner electrodes 13b.

After layering is completed, due to the nature of the green sheets, the upper green sheets sag at the upper part of the window sections 25 (25a and 25b), and thus partially cover the window sections. Moreover, the edges of the ceramic green sheets 22A and 22B all sag. If this is the case, the ceramic green sheet 22A sags and noticeably covers the window section, because it is thinner.

As shown in FIG. 6, where the window sections 25 are aligned vertically (window section vertical region 25A), every other layer is a space, not an inner electrode layer 24. On the other hand, in a region around the window section 25 (window section peripheral region 25B), the inner electrode layers 24 of every green sheet vertically face each other, thereby causing no sagging of the green sheets. Accordingly, the window section peripheral regions 25B bulge slightly from the window section vertical region 25A.

(2)-5 Formation of Through Hole by Laser Radiation (Step S150)

Next, using a laser processor, a through hole 26 for filling the conductive material therein is formed in the above-described sheet layer body 100 in the following manner. In this embodiment, the conductive material (conductive paste) filled in through hole 26 becomes the via electrodes 15a and 15b of FIG. 1 after the product is completed.

As shown in FIG. 6, in the above-described sheet layer body 100, the window sections 25 provided respectively in the ceramic green sheets 22A and 22B are arranged in every other layer vertically, that is, in the direction normal to the planes along which the sheets are layered. The layer processor applies laser beams 150 along the axis line (alternate long and short dashed lines in FIG. 6) connecting the center parts of the vertically-placed window sections 25. As a result, the ceramic green sheets 22A and 22B, the inner electrode layer 24, and the cover sheet 29 positioned on the axis line are all melted by heat generated through laser irradiation, and around the axis line, the through hole 26 is formed to pass through the layer body in the vertical direction.

Figure 7:
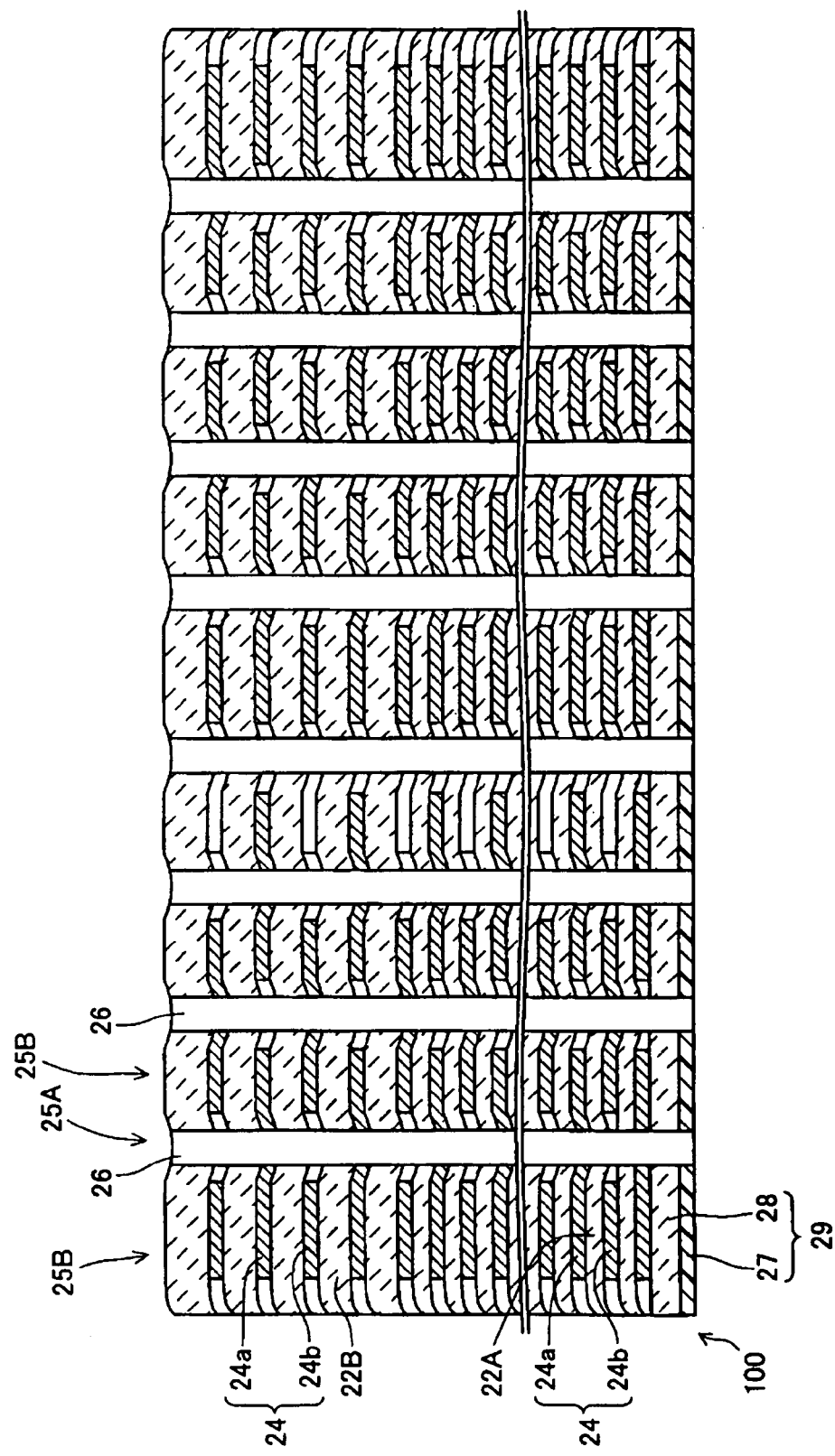
FIG. 7 is a diagram schematically showing one example of a through hole 26 formed straight through the layered sheets in accordance with an embodiment of the invention.

FIG. 7 is an illustration diagram schematically showing the through hole 26 formed in a straight configuration. As shown in FIG. 7, the through hole 26 is so formed as to have a hole diameter smaller than that of the window sections 25. In this manner, current does not pass between the inner electrode layer 24 around the window sections 25 and the via electrodes 15a and 15b formed in the through hole 26 upon filling. In this embodiment, the hole diameter of the through hole 26 is set to 120 μm so that the resulting through hole has a diameter of 100 μm after baking, and the window section 25 has a diameter of 350 μm. The diameters are not restricted to these values, and the through hole 26 may be set to be from 60 to 150 μm. If this is the case, to determine the hole diameter of the through hole, the viscosity and other characteristics of the later described conductive material (filling material) used for filling the through hole 26 may be considered. Moreover, in determining the diameter of the window section 25, the pitch or other characteristics of the window section 25 may be considered.

The sheet layer body 100 shown in FIG. 6 has a square shape viewed from the above, and the window sections 25 therein are arranged in a matrix. Accordingly, not only are the eight portions shown in FIG. 7 irradiated with the laser beams 150, but also similarly the matrix of window sections 25, from the top surface of the square-shaped sheet layer body. Accordingly, a plurality of through holes 26 arranged in a matrix is formed in the sheet layer body 100.

In the present embodiment, the technique used for forming the through holes 26 at a plurality of different positions of the sheet layer body 100 is called cycle processing. As shown in FIG. 6, cycle processing is a technique of gradual through hole formation by repeatedly executing a process CY exposing the through hole formation positions to the laser beam 150 to gradually deepen the hole.

As shown in the drawing, in this example, the cover sheet 29 is positioned to be on the side on which the laser beams 150 are irradiated. With such a structure, favorably, substances melted by irradiation of the laser beams 150 (e.g., organic components of the electrodes or green sheets) do not become attached to the surface of the ceramic green sheet 22A.

In the above-described processes before step S150, the process order may be changed. For example, the carrier film peeling of step S130 and the sheet layering of step S140 may be carried out in reverse order, or the sheet cutting-out of step S120 may be carried out prior to the electrode layer formation of step S10. Note here that as well, step S120 may be carried out before step S110, and also step S140 may be carried out before step S130.

(2)-6 Conductive Material Filling of Through Hole (step S160)

Next, the through holes 26 of the sheet layer body 100 are filled with a conductive material. For filling, a filling container (not shown) is set on the sheet layer body 100, and inside the filling container, the conductive material is pressurized and injected in the through hole 26. The conductive material injected by pressurization is filled in the through hole 26, and is cured after passing through the inside of the through hole 26 and reaching the end surface of the inner electrode layer 24. The conductive material thus cured functions as the above-described via electrodes 15a and 15b (refer to FIG. 1).

(2)-7 Main Pressure Bonding Process (step S170)

Next, a process is executed to pressure bond the layers of the sheet layer body 100 in which the conductive material has been filled. In this pressure bonding process, the sheet layer body 100 is set in a pressurization container (not shown), and is pressed at high-temperature and high-pressure. This exerts a large force on the window section peripheral region 25B where the inner electrode layers 24 bulge at the surface of the sheet layer body 100. In such manner, the ceramic green sheets 22A and 22B are both bonded firmly.

(2)-8 Formation, Grooving, Degreasing, Baking, and Breaking of Surface Electrode (step S180)

Next, the sheet layer body 100 is extracted from the pressurization container and provided with surface electrodes (top-side terminals 16 and bottom-side terminals 17), for example, by screen printing. The inter-terminal pitch of the top-side terminals 16 is approximately the same as the pitch of the via electrodes. The terminals are formed at locations (corresponding to the upper end of the above-described via electrodes 15b) at which the conductive paste is exposed from the upper surface of the layer body as a result of the above integration of layers. On the other hand, the bottom-side terminals 17 are formed at the portions (portion corresponding to the upper end of the above-described via electrode 15a) at which the conductive paste is exposed from the upper and lower surfaces of the layer body as a result of integration (top and bottom surfaces of the condenser). The size and inter-terminal pitch are determined in consideration of the shrinkage of the conductive paste after the baking during such terminal formation which will be described below. In this case, the bottom-side terminal 17 is formed at a pitch suited to the pitch of the package 50 (bump 57 specifically) that is the connection object. In the present example, the bottom-side terminal 17 is formed at the same pitch as the top-side terminal 16, but depending on the positions formed in the package, a different pitch is possible.

Thereafter, the sheet layer body 100 is grooved in accordance with the size of the multilayer ceramic capacitor 10 in use, and then the thus grooved layer body is degreased before baking. After baking, the multilayer ceramic capacitor 10 as shown in FIG. 1 is formed. Herein, by braking the thus baked sheet layer body 100 along the groove (not shown) made in the grooving process, the resulting multilayer ceramic capacitor 10 will be reduced in size to a greater degree.

A-3. Action and Effects

As described in the foregoing, in the multilayer ceramic capacitor 10 of this embodiment, as shown in FIG. 1, not only in the first layer body 11 occupying most of the multilayer ceramic capacitor 10 but also in the second layer body 12 having a ceramic layer 14 thicker than the ceramic layer 14 of the first layer body 11, the inner electrodes 13a and 13b face each other and sandwich the ceramic layer 14. Between these inner electrodes, electrical continuity is established by the via electrodes 15a and 15b. Moreover, in this multilayer ceramic capacitor 10, in the second layer body an inner electrode 13b is provided on every ceramic layer 14, and all first and second inner electrodes 13b are connected by first and second via electrodes 15b, respectively.

Accordingly, compensation for the electrode height difference which in a conventional capacitor is achieved by changing the base layer can now be achieved with the upper surface layer of the second layer body 12, that is, with the dielectric layer (ceramic layer 14) disposed toward the upper surface of the capacitor. This is done by increasing the thickness of the ceramic layer 14 in the second layer body 12. At the same time, the portion of the via electrode 15b which is not connected with an inner electrode 13b can be shortened. Thus, according to the multilayer ceramic capacitor 10 of this embodiment, the inductance can be reduced while compensating for the electric height difference caused by layering plural inner electrodes.

Moreover, with the multilayer ceramic capacitor 10, the via electrodes 15a and 15b linearly extend continuously from the top surface 10a to the bottom surface 10b of the capacitor. Accordingly, the via electrode 15a and the via electrode 15b can serve as wires passing through the top and bottom surfaces of the multilayer ceramic capacitor 10. Thus, the via electrode that has been conventionally used only to electrically connect the inner electrode layers can newly serve as wires passing through the top and bottom surfaces of the capacitor. Therefore, according to the multilayer ceramic capacitor 10, as shown in FIG. 1, an electric device (e.g., IC chip 30 and package 50) can be connected to the top and bottom surfaces of the capacitor, allowing variation in installation. In such case, the pitch of the top-side terminal 16 (pitch of the via electrode 15a) on the top surface 10a can be matched to the terminal pitch of the IC chip 30, and the bottom-side terminal 17 (the integral multiple interval of the via electrode 15b pitch) on the bottom surface 10b can be matched to the bump pitch of the package 50. Accordingly, this can improve the flexibility of device connection to the top and bottom surfaces of the capacitor.

Moreover, on the top and bottom surfaces of the capacitor, the top-side terminals 16 and the bottom-side terminals 17 are formed for every via electrode and serve as the terminals for the via electrodes 15a and 15b. Such a structure simplifies lead connection to the via electrode through the terminal, and connection to other components. More specifically, the bumps 57 of the package 50 can be connected to the bottom-side terminals 17 of the multilayer ceramic condenser 10 with ease and reliability. This is also true of the pad 32 of the IC chip 30.

B. Modified Example

Figure 8:
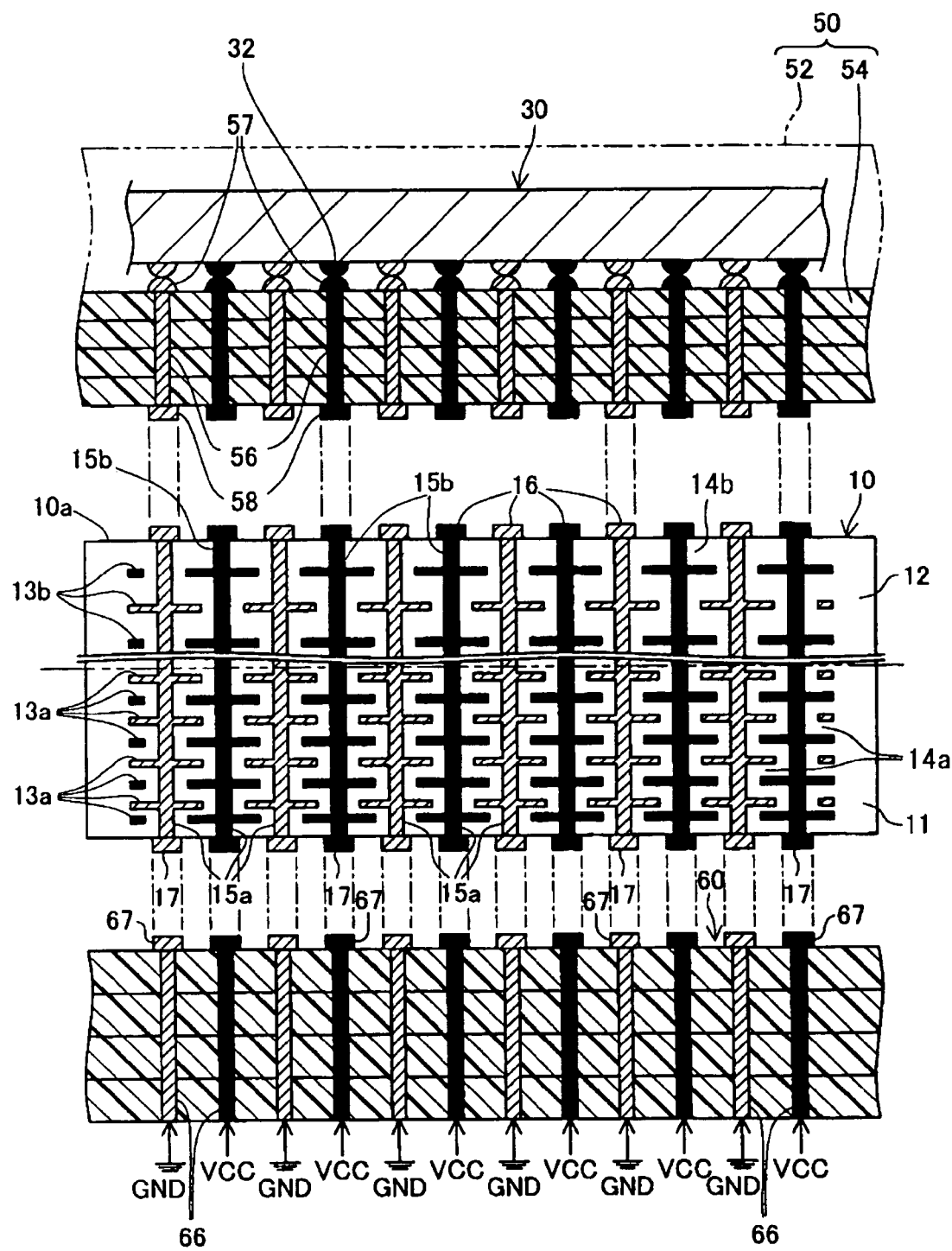
FIG. 8 is a diagram showing a modified example of the multilayer ceramic capacitor 10.

In the above example, the multilayer ceramic capacitor 10 is interposed between the package 50 and the IC chip 30. Alternatively, the multilayer ceramic capacitor 10 may be interposed between other electric devices. FIG. 8 is a diagram showing a modified Example 1 of the multilayer ceramic capacitor 10.

In the modified example shown in FIG. 8, the package 50 to which the IC chip 30 is attached is connected with a wiring board 60, e.g., a motherboard, via the multilayer ceramic condenser 10. The IC chip 30 and the package 50 are the same as those in the above-described example.

The wiring board 60 is a multilayer substrate made of epoxy resin onto which wiring configurations and components are packaged for control purposes. Examples of wiring boards 60 are printed substrates including a motherboard. Among the layers of the wiring board 60, a lead 66 formed by a copper-plated layer or a copper foil is used to pass current. The lead 66 is provided with a terminal 67 exposed to the upper surface (surface on the upper side of FIG. 8) of the wiring board 60. This terminal 67 is soldered for connection to the bottom-side terminal 17 of the multilayer ceramic condenser 10. Here, in FIG. 8, the lead 66 and the terminal 67 connected to the power line are solidly blackened, and the lead 66 and the terminal 67 connected to the ground line are hatched, and leads serving as signal lines are omitted.

In an alternative structure, the multilayer ceramic capacitor of the above example or a modified example may be previously provided with an IC chip, package, or wiring board. If this is the case, examples are: an IC-chip-attached capacitor in which an IC chip is connected to via electrodes of the multilayer ceramic capacitor, a capacitor-installed package in which a package is connected to terminals of the via electrodes of the multilayer ceramic capacitor, a capacitor-installed wiring board in which terminals provided for via electrodes of the multilayer ceramic capacitor are connected to the wiring board, and a structure derived by connecting an IC chip and a package with the multilayer ceramic capacitor interposed therebetween.

Figure 9:
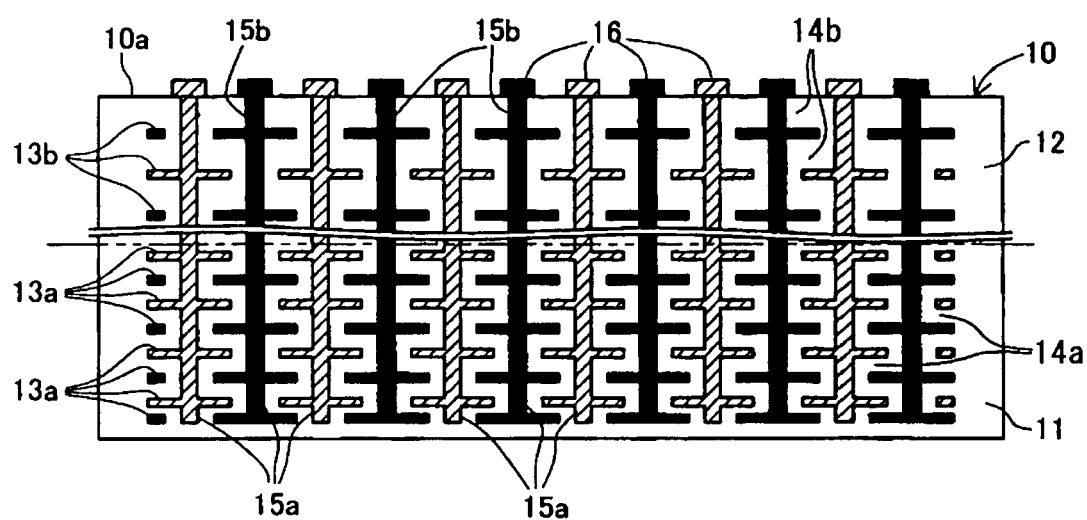
FIG. 9 is a diagram showing multilayer ceramic capacitor 10 modified to include top-side terminals 16 on one capacitor surface only.

The present invention is not restricted to the above examples, and it is understood that numerous other modifications and variations can be envisioned without departing from the scope of the invention. For example, in the above examples, the top-side terminals 16 and the bottom-side terminals 17 are provided respectively on the top and bottom surfaces of the capacitor. Alternatively, as shown in FIG. 9, terminals (e.g., top-side terminal 16) may be provided only on one surface of the capacitor. In the case where only one capacitor surface is provided with a terminal, the via electrode need not pass through the capacitor, and the via electrode need only reach the inner electrode at the bottom.

Figure 10:
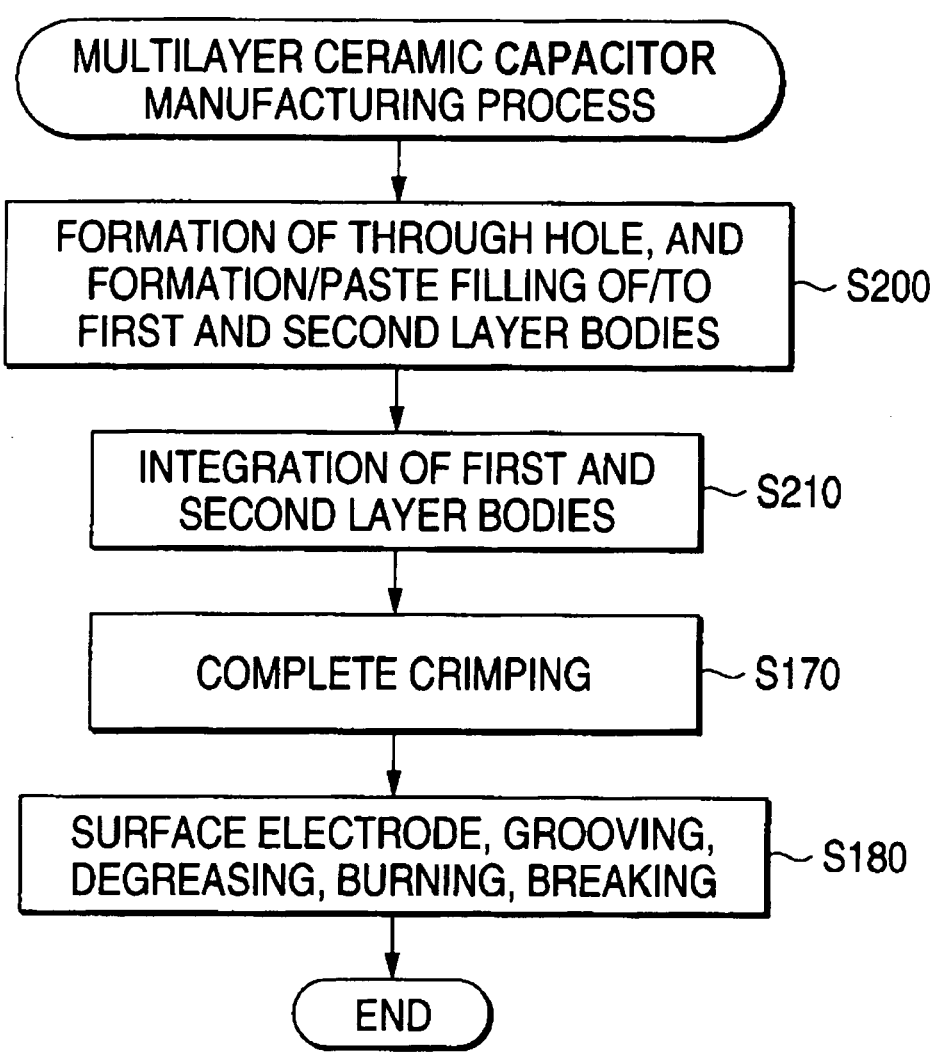
FIG. 10 is a process diagram showing a modified example of the manufacturing process of the multilayer ceramic capacitor 10.

Described next is a manufacturing method (modified example) different from the above-described examples. In the above examples, the first layer body 11 and the second layer body 12 are formed through sequential layering. On the other hand, in this modified example, the first layer body 11 and the second layer body 12 are previously formed, and then put together to form the multilayer ceramic capacitor 10. Such characteristics will be described below. FIG. 10 is a process diagram showing a modified example of the manufacturing process of the multilayer ceramic capacitor 10.

In the manufacturing method of this modified example, the first layer body 11 and the second layer body 12 separated by the chain double-dashed lines of FIG. 1 are individually manufactured as shown in FIG. 10 (step S200), and the following procedure is carried out for each of the layer bodies. First, the first layer body 11 is described.

To form the first layer body 11, after completing process steps S100 to 160 described by reference to FIG. 3, the first layer body 11 in which the inner electrodes 13a is layered while sandwiching the ceramic layer 14 is formed. Thereafter, a through hole is formed by laser irradiation, and then the resulting through hole is filled with a conductive material. On the other hand, at the same time as formation of the first layer body 11, the second layer body 12 is also formed by carrying out the processes of steps S100 to 160 described previously in reference to FIG. 3, i.e., the second layer body 12 is formed by layering the inner electrode 13a while sandwiching the ceramic layer 14, a through hole is formed by laser irradiation, and then the resulting through hole is filled with a conductive material. In this case, in the first layer body 11 and the second layer body 12 through holes of the same pitch are formed.

After the first layer body 11 and the second layer body 12 are formed, they are put together (step S210). The layer bodies are put together so that the conductive paste filled in the through holes of the first layer body 11 passing through the layer body is bonded to the conductive paste filled in the through holes of the second layer body 12.

Next, the layer body resulting from bonding is subjected to the complete pressure bonding process by a high-temperature, high-pressure press (step S170) described above in reference to FIG. 3. Thereafter, the top-side terminals 16 and the bottom-side terminals 17 provided on the top and bottom surfaces of the capacitor are subjected to formation, grooving, degreasing, baking, and breaking (step S180), and thus the multilayer ceramic condenser 10 as shown in FIG. 1 is completed.

In such a manufacturing method, the ceramic layer 14 in the second layer body 12 may be varied in thickness, or second layer bodies 12 of various thicknesses may be prepared for exchange there among depending on the intended application of the multilayer ceramic capacitor 10. For example, if the capacitor is required to have strength while maintaining low-inductance to a certain degree, a second layer body 12 having a thicker ceramic layer 14 of about 30 μm may be used.

The manufacturing method of the above modified examples may be modified to a greater degree as follows. In the above modified examples, the first layer body 11 and the second layer body 12 through holes all may already be filled with the conductive material. This is not required, and the layer bodies may put together with the through holes remaining unfilled. As a possible modification, in the state where the through hole has just been formed, the first layer body 11 and the second layer body 12 may be layered together and then the conductive material may be filled therein.

Moreover, also in the case of putting the second layer body 12 on the first layer body 11 with their through holes already filled with the conductive material, the following modification is possible. In each of the ceramic green sheets 22B shown in FIG. 5 a through hole is formed for filling the conductive material. Thereafter, the ceramic green sheets 22B thus filled with the conductive material whose though holes are already filled with the conductive material are successively layered on the first layer body 11 to form the second layer body 11. Similarly, the second layer body 12 may be formed first, and on this may be sequentially overlaid ceramic green sheets 22A filled with the conductive material to form the first layer body 11.

As described in the foregoing, if the first layer body 11 and the second layer body 12 are layered together after formation of their respective through holes is completed, or further after filling of the conductive material, the following advantage can be derived.

For example, the second layer body 12 may be overlaid on the first layer body 11 if it is provided with via electrodes 15b at a pitch which is an integral multiple of the via electrodes of the first layer body 11 (e.g., twice). That is, it is easy to vary the pitch or positions of the terminals of the via electrode (top-side terminal 16 and the bottom-side terminal 17) on the top and bottom surfaces of the condenser.

C. Modified Example 2

Figure 11:
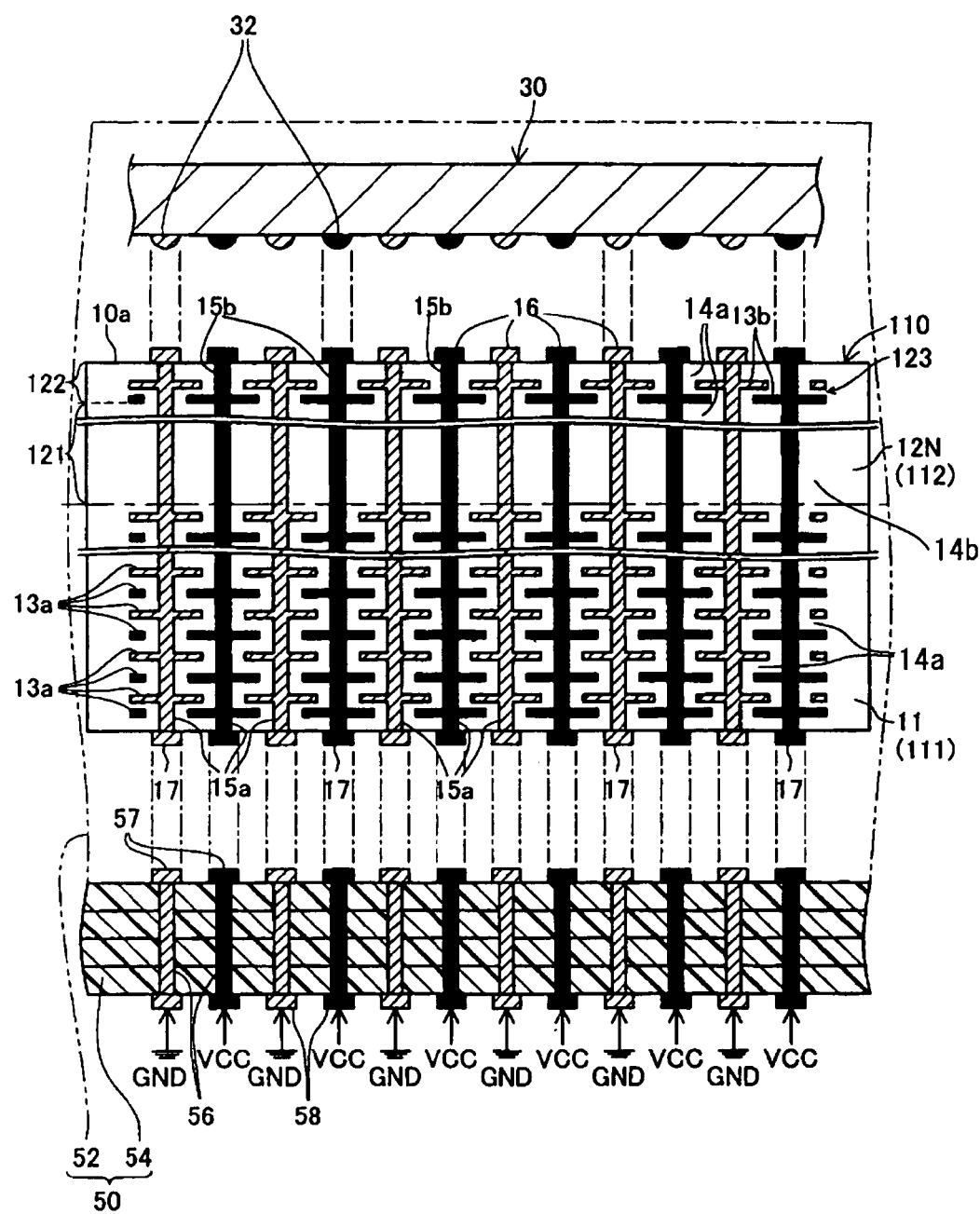
FIG. 11 is a diagram showing another modified example of the multilayer ceramic capacitor.

Moreover, the following modification is also possible. FIG. 11 is a diagram showing another modified example 2 of the multilayer ceramic capacitor. In the modified example shown in FIG. 11, the IC chip 30 and the package 50 are the same as in the above-described examples.

As shown in the drawing, in this modified example, the layer body is provided with a second layer body 12N by the side of the top surface 10a of a multilayer ceramic capacitor 110 (surface layer side of the condenser) and then with first layer body 11. In this case, the first layer body 11 is the same as the first layer body 11 in the above-described examples, and serves as the electrode layer section in this embodiment. The second layer body 12N serves as the dielectric layer section in this embodiment. The second layer body 12N is composed of a thick portion 121 and a conductive layer section 122, and the conductor layer section includes a capacitor structure portion 123. In the multilayer ceramic capacitor 110, except for the first layer body 11 and the second layer body 12N, the structure is the same as the multilayer ceramic capacitor 10 of the above-described examples.

In this modified example, the multilayer ceramic capacitor 110 has a thickness of about 0.5 mm. The first layer body 11 (electrode layer section) has a thickness of about 350 μm. The second layer body 12N (dielectric layer section) has a thickness of about 140 μm. The thick portion 121 has a thickness of about 125 μm. The conductor layer section 122 has a thickness of about 15 μm. One capacitor structure portion 123 has a thickness of about 10 μm. The conductor layer section 122 has ceramic layers 14 of about 5 μm in thickness and inner electrodes 13b of about 2 μm in thickness, two of each. The thick portion 121 has five ceramic layers 14 so that it is 25 μm in thickness. The first layer body 11 (electrode layer section) has ceramic layers 14 of about 5 μm in thickness and inner electrodes 13a of about 2 μm in thickness, fifty of each.

Also in this modified example, effects similar to those derived by the multilayer ceramic capacitor 10 of FIG. 1 are achieved.

D. Comparison of Inductance Value Between Example (Modified Example) and Comparison Example

Example 1

The multilayer ceramic capacitor of the example (FIG. 1) is formed to have outer dimensions of 5.2 mm×5.2 mm in a direction perpendicular to the layer direction. The inner electrodes 13a and 13b (13) have outer dimensions of 4.6 mm×4.6 mm, and 196 via electrodes are formed in total (14 via electrodes in the longitudinal direction×14 via electrodes in the transverse direction). The via electrodes 15a and 15b (15) comprise first and second via electrodes alternating with each other at the same pitch (330 μm interval). The first via electrode 15 (15a1 as hatched in the drawing) passes through the electrode layer section, establishes continuity with the first electrode layers 13a and 13b (13) (13a1 as hatched in the drawing), and is insulated from the second electrode layers 13 (13a2 as solidly blackened in the drawing). The second via electrode 15 (15a2 as solidly blackened in the drawing) passes through the electrode layer section, establishes continuity with the second electrode layer (solidly blackened in the drawing), and is insulated from the first electrode layers. The electrode layer section (111) is obtained by alternately layering twenty-six layers of the first electrode layer 13a serving as an inner electrode and twenty-five layers of the second electrode layer 13a serving as an inner electrode while sandwiching ceramic layers 14 having a thickness of about 5 μm therebetween. Accordingly, the electrode layer section (111) includes fifty-one layers of the ceramic layer 14 sandwiched by the inner electrodes, and has a thickness of about 350 μm. The dielectric layer section (112) is obtained by alternately layering two layers each of the first electrode layer 13b serving as an inner electrode and the second electrode layer 13b serving as inner electrodes, and sandwiching ceramic layers 14 having thickness of about 10 μm therebetween. Accordingly, the dielectric layer section (112) includes five ceramic layers 14 sandwiched between the inner electrodes, and has a thickness of 58 μm.

Example 2

In the multilayer ceramic condenser of Example 1, the dielectric layer section (112) is derived by alternately layering layers of the first electrode layer 13b serving as an inner electrode, and layers of the second electrode layer 13b serving as inner electrodes, two layers each, sandwiching ceramic layers 14 having a thickness of about 20 μm, to prepare Example 2. Moreover, the space between the inner electrode closest to the condenser surface and the condenser surface is set to be 10 μm. Accordingly, the dielectric layer section (11) includes five of the ceramic layers 14 to be sandwiched between the inner electrodes, and has a thickness of 98 μm.

Example 3

The multilayer ceramic condenser of modified Example 2 (FIG. 11) was formed to have outer dimensions of 5.2 mm×5.2 mm in a direction perpendicular to the layer direction to prepare Example 3. The inner electrodes 13a and 13b (13) have outer dimensions of 4.6 mm×4.6 mm, and 196 via electrodes were formed in total (14 via electrodes in the longitudinal direction×14 via electrodes in the transverse direction). The via electrodes 15a and 15b (15) comprise first and second via electrodes alternating at the same pitch (330 μm interval). The first via electrode 15 (hatched in the drawing) passes through the electrode layer section and electrically connects with the first electrode layers 13a and 13b (13) (hatched in the drawing), and is insulated from the second electrode layers 13 (solidly blackened in the drawing). The second via electrode 15 (solidly blackened in the drawing) passes through the electrode layer section, electrically connects with the second electrode layers, and is insulated from the first electrode layers. The electrode layer section (111) is obtained by alternately layering the first and second electrode layers 13a serving as inner electrodes, twenty-six first electrode layers 13a and twenty-five second electrode layers 13a in all, sandwiching ceramic layers 14 having a thickness of about 5 μm. Accordingly, the electrode layer section (111) includes fifty-one layers of the ceramic layer 14 having a thickness of about 350 μm. The dielectric layer section (112) is structured by the thick portion (121) and the conductor layers (122). The thick portion (121) is formed only from the ceramic layer 14, and has a thickness of 43 μm. One conductor layer section (122) is 24 μm in thickness, and contains a capacitor structure portion (123) of 14 μm in thickness. The capacitor structure portion (123) is obtained by sandwiching a ceramic layer 14 of about 10 μm in thickness with the first electrode layer 13b serving as an inner electrode of about 2 μm in thickness and the second electrode layer 13b serving as an inner electrode of about 2 μm in thickness. Accordingly, the capacitor portion includes an inner electrode on both sides of a ceramic layer (dielectric layer) of about 10 μm in thickness. Herein, the thickness of the capacitor portion is a value calculated by adding the thickness of every inner electrode and the thickness of the ceramic layers formed between the inner electrodes.

Example 4

In the multilayer ceramic capacitor of Example 3, the thick portion (121) is set to have a thickness of 74 μm to prepare Example 4.

Example 5

In the multilayer ceramic capacitor of Example 3, one conductor layer section (122) has a thickness of 72 μm, and contains a capacitor structure portion (123) of 62 μm in thickness to prepare Example 5. The capacitor portion (123) is formed by alternately layering a first electrode layer 13b (three layers in all) of about 2 μm in thickness serving as an inner electrode, and a second electrode layer 13b of about 2 μm in thickness serving as an inner electrode, sandwiching a ceramic layer 14 of about 10 μm in thickness. That is, the capacitor structure portion includes an inner electrode on both sides of five ceramic layers (dielectric layers) of about 10 μm in thickness Comparative Examples 1 to 8.

The electrode layer section (111) similar to that of the multilayer ceramic capacitor of Examples 1 to 3 was formed, and no inner electrode (conductor layer) was formed in the dielectric layer section (112). Multilayer ceramic capacitors in which the dielectric layer section (112) having no inner electrode were prepared, having a thickness of 10 μm, 19 μm, 39 μm, 58 μm, 67 μm, 115 μm, and 170 μm, respectively.

For these samples, an inductance value L was measured in the following manner. The measurement device that was used is an impedance analyzer of an automatic balance bridge type, connecting terminals of the measuring device by abutting the surface layer electrodes of the multilayer ceramic capacitor to air coplanar microprobes. A capacitance value C and the self-resonance frequency fo using a measurement frequency of 1 kHz was measured so as to calculate an inductance value L using the following equation $L=1/(4\cdot\pi^2\cdot fo^2\cdot C)$.

Table 1 below shows the inductance values of the Examples and Comparative Examples. In Comparative Examples 1 and 2 in which the dielectric layer section (112) had no inner electrode, and the first dielectric layer section and the second dielectric layer section were both made thin, the electrode height difference of the inner electrodes was not sufficiently compensated. This in turn caused insufficient bonding between the sheets in the layering process at the time of sample manufacturing. Thus, it was impossible to manufacture samples having no structural defect. As to Comparative Examples 3 to 10, although the dielectric layer section (112) is capable of sufficiently absorbing the electrode height difference, their inductance values were higher than those of Examples 1 to 3 having inner electrodes in the dielectric layer section (112). Accordingly, in the invention the dielectric layer section (112) has sufficient thickness to absorb the electrode height difference, and the via electrode portion that is not connected with inner electrodes is shortened. As a result, a multilayer ceramic capacitor having a low inductance value was achieved. Moreover, in Comparative Examples 3 to 8 in which the thickness of the dielectric layer section (112) was 20 μm or thicker, the inductance value tended to increase due to the longer via electrode. However, in Examples 1 to 3, despite a thicker dielectric layer section (112), the inductance value was reduced. This is because the dielectric layer section (112) contained inner electrodes, and the length of a via electrode not connected to an inner electrode was shortened.

TABLE 1

| | THICKNESS OF ELECTRODE LAYER SECTION (111) | THICKNESS OF DILECTRIC LAYER SECTION (112) | INNER ELECTRODE LAYER IN DIELECTRIC LAYER SECTION | INDUCTANCE VALUE |
|---|---|---|---|---|
| EXAMPLE 1 | 350 μm | 58 μm | YES (4 INNER ELECTRODE LAYERS + 5 DIELECTRIC LAYERS) | 0.80 pH |
| EXAMPLE 2 | 350 μm | 98 μm | YES (4 INNER ELECTRODE LAYERS + 5 DIELECTRIC LAYERS) | 0.49 pH |
| EXAMPLE 3 | 350 μm | 67 μm | YES (2 INNER ELECTRODE LAYERS, DIELECTRIC LAYER SECTION INCLUDING 2 DIELECTRIC LAYERS + 43 μm THICK PORTION) | 1.11 pH |
| EXAMPLE 4 | 350 μm | 98 μm | YES (2 INNER ELECTRODE LAYERS, DIELECTRIC LAYER SECTION INCLUDING 2 DIELECTRIC LAYERS + 74 μm THICK PORTION) | 1.25 pH |
| EXAMPLE 5 | 350 μm | 115 μm | YES (6 INNER ELECTRODE LAYERS, DIELECTRIC LAYER SECTION INCLUDING 6 DIELECTRIC LAYERS + 43 μm THICK PORTION) | 0.83 pH |
| COMPARISON EXAMPLE 1 | 350 μm | 10 μm | NO | NOT-MANUFACTURABLE |
| COMPARISON EXAMPLE 2 | 350 μm | 19 μm | NO | NOT-MANUFACTURABLE |
| COMPARISON EXAMPLE 3 | 350 μm | 39 μm | NO | 1.87 pH |
| COMPARISON EXAMPLE 4 | 350 μm | 58 μm | NO | 2.01 pH |
| COMPARISON EXAMPLE 5 | 350 μm | 67 μm | NO | 2.10 pH |
| COMPARISON EXAMPLE 6 | 350 μm | 98 μm | NO | 2.51 pH |
| COMPARISON EXAMPLE 7 | 350 μm | 115 μm | NO | 2.81 pH |
| COMPARISON EXAMPLE 8 | 350 μm | 170 μm | NO | 4.15 pH |

While the invention has been described in detail and with reference to specific embodiments thereof, it will be apparent to one skilled in the art that various changes and modifications can be made therein without departing from the spirit and scope thereof.

This application is based on Japanese Patent Application No. 2003-407351 filed Dec. 5, 2003, incorporated herein by reference in its entirety.

What is claimed is:

1. A capacitor comprising:
    an electrode layer section comprising a plurality of layered inner electrodes facing each other and sandwiching dielectric layers, and via electrodes formed in a direction normal to the planes along which the inner electrodes are layered for passing current among the inner electrodes, and
    a dielectric layer section comprising a plurality of dielectric layers provided over the electrode layer section at an upper surface side of the capacitor,
    wherein the dielectric layer section includes inner electrodes facing each other and sandwiching dielectric layers, the space between the inner electrodes in the dielectric layer section being wider than the space between the inner electrodes in the electrode layer section, and
    the via electrodes electrically connect the inner electrodes in the dielectric layer section.

2. The capacitor as claimed in claim 1, wherein
    the space between the inner electrodes in the dielectric layer section is twice to 20 times wider than the space between the inner electrodes in the electrode layer section.

3. The capacitor as claimed in claim 1, comprising terminals formed on a upper surface of the dielectric layer section connected to corresponding via electrodes.

4. The capacitor as claimed in claim 3, comprising terminals formed on the surface of the electrode layer section opposite the dielectric layer section connected to corresponding via electrodes.

5. A capacitor comprising:
an electrode layer section comprising a plurality of layered inner electrodes facing each other and sandwiching dielectric layers, and via electrodes formed in a direction normal to the planes along which the inner electrodes are layered for passing current among the inner electrodes, and
a dielectric layer section comprising a plurality of dielectric layers provided over the electrode layer section at an upper surface side of the capacitor,
wherein the dielectric layer section includes a conductor layer section disposed toward the upper surface side of the capacitor, and a thick portion disposed toward the electrode layer section;
wherein the conductor layer section includes a capacitor portion comprising inner electrodes facing each other and sandwiching part of the dielectric layer, and
the via electrodes electrically connect the inner electrodes in the conductor layer section; and
wherein the space between the capacitor upper surface and the inner electrodes closest to the capacitor surface in the conductor layer section is equal to or narrower than the thickness of the portion of the capacitor constituting the conductor layer section.

6. A capacitor as claimed in claim 1 equipped with a semiconductor element, the semiconductor element being connected to a side of the dielectric layer section of the capacitor so as to pass current to the via electrodes.

7. A capacitor as claimed in claim 5 equipped with a semiconductor element, the semiconductor element being connected to a side of the dielectric layer section of the capacitor so as to pass current to the via electrodes.

8. A capacitor as claimed in claim 1 integrated in a wiring board, and containing, on a side of the dielectric layer section, connecting with the wiring board which includes a power line and a ground line, so as to pass current to the via electrodes.

9. A capacitor as claimed in claim 5 integrated in a wiring board and containing, on a side of the dielectric layer section, connecting with the wiring board which includes a power line and a ground line, so as to pass current to the via electrodes.

10. A capacitor as claimed in claim 1 integrated with a substrate, containing on a surface of the electrode layer section away from the dielectric layer section connecting with the substrate, which includes a power line and a ground line, so as to pass current to the via electrodes.

11. The capacitor as claimed in claim 5 integrated with a substrate, containing on a surface of the electrode layer section away from the dielectric layer section connecting with the substrate which includes a power line and a ground line, so as to pass current to the via electrodes.

12. A method of manufacturing a capacitor including an electrode layer section comprising a plurality of layered inner electrodes facing each other and sandwiching dielectric layers, and via electrodes formed in a direction normal to the planes along which the inner electrodes are layered for passing current among the inner electrodes, and a dielectric layer section comprising a plurality of dielectric layers provided over the electrode layer section at an upper side surface of the capacitor,
wherein the dielectric layer section includes inner electrodes facing each other and sandwiching dielectric layers, the space between the inner electrodes in the dielectric layer section being wider than the space between the inner electrodes in the electrode layer section, and the via electrodes electrically connect the inner electrodes in the dielectric layer section, the method comprising:
a step (1) of forming the inner electrodes, which comprises alternately layering inner electrodes material for a first electrode layer and a second electrode layer facing the first electrode layer and sandwiching dielectric material forming the dielectric layer to obtain a first layered body, and alternately layering inner electrodes material for a third electrode layer and a fourth electrode layer facing the third electrode layer and sandwiching dielectric material forming the dielectric layer having a thickness greater that that of the dielectric layer of the first layered body to obtain a second layered body, and then stacking and integrating the two layered bodies; and
a step (2) of forming, in the integrated first layer body and the second layer body, first through holes passing through the first electrode layers in the first layered body and the third electrode layers in the second layer body, and second through holes passing through the second electrode layers in the first layer body and the fourth electrode layer in the second layer body, and filling a conductive paste in each of the through holes.

13. The method as claimed in claim 12, wherein the step (1) includes:
a step (1a) of first forming either the first layer body or the second layer body; and
a step (1b) of integrating the first layer body and the second layer body by forming the other of the first layer body and second layer body so as to be stacked upon the previously-formed layer body.

14. The method as claimed in claim 13, wherein in the step (1b),
when the other of the first layer body and second layer body is formed so as to be stacked on the previously-formed layer body, the dielectric material for forming the other of the first layer body and second layer body is sequentially layered on the previously-formed layer body.

15. A method of manufacturing a capacitor including an electrode layer section comprising a plurality of layered inner electrodes facing each other and sandwiching dielectric layers, and via electrodes formed in a direction normal to the planes along which the inner electrodes are layered for passing current among the inner electrodes, and a dielectric layer section comprising a plurality of dielectric layers provided over the electrode layers section at a upper surface side of the capacitor,
wherein the dielectric layer section includes inner electrodes facing each other and sandwiching dielectric layers, the space between the inner electrodes in the dielectric layer section being wider than the space between the inner electrodes in the electrode layer section, and
the via electrodes electrically connect the inner electrodes in the dielectric layer section, the method comprising:

a step (1) of first forming either a first layer body serving as the electrode layer section or a second layer body serving as the dielectric layer section; and a step (2) of integrating the first layer body and the second layer body by forming the other of the first layer body and second layer body upon the previously-formed layer body, wherein the first layer body is formed by alternately layering an inner electrodes formation material forming a first electrode layer and a second electrode layer facing the first electrode layer and sandwiching a dielectric material forming the dielectric layer, and in the resulting layer body forming first layer body first through holes passing through the first electrode layers and first layer body second through holes passing through the second electrode layers and filling a conductive paste into the first layer body through holes, the second layer body is formed by layering inner electrodes formation material forming a third electrode layer and a fourth electrode layer sandwiching a dielectric material forming a dielectric layer having a thickness greater than the space between the first and second electrodes in the first layer body, and in the resulting layer body forming second layer body first through holes passing through the third electrode layer and second layer body second through holes passing though the fourth electrode layer, overlaying the second layer body through hole passing through the third electrode layer on the first layer body through hole passing through the first electrode layer, overlaying the second layer body through hole passing through the fourth electrode layer on the first layer body through hole passing through the second electrode layer, and filling a conductive paste into the second layer body through holes, and the step (2) includes sequentially layering the dielectric material for forming the other of the first layer body and second layer body on the previously-formed layer body, wherein the previously-formed layer body through hole has already been formed and filled with the conductive paste, for forming the other of the first layer body and second layer body upon the previously-formed layer body.

16. A method of manufacturing a capacitor including an electrode layer section comprising a plurality of layered inner electrodes facing each other and sandwiching dielectric layers, and via electrodes formed in a direction formal to the planes along which the inner electrodes are layered for passing current among the inner electrodes, and a dielectric layer section comprising a plurality of dielectric layers provided over the electrode layer section at an upper surface side of the capacitor, wherein the dielectric layer section includes inner electrodes facing each other and sandwiching dielectric layers, the space between the inner electrodes in the dielectric layer section being wider than the space between the inner electrodes in the electrode layer section, and the via electrodes electrically connect the inner electrodes in the dielectric layer section, the method comprising:

a step (1) of forming a first layer body which is the electrode layer section and a second layer body which is the dielectric layer section; and a step (2) of integrating the first and second layer bodies, wherein in the first layer body formed in the step (1), inner electrodes formation material for a first electrode layer and a second electrode layer facing the first electrode layer is alternately layered, sandwiching a dielectric material forming the dielectric layer, and first layer body first through holes are formed to pass through the first electrode layers and first layer body second through holes are formed to pass through the second electrode layers in the resulting first layer body, in the second layer body formed in the step (1), inner electrodes formation material for a third electrode layer and a fourth electrode layer is layered, sandwiching dielectric material forming a dielectric layer having a thickness greater than the space between the inner electrodes in the first layer body, and second layer body first through holes are formed to pass through the third electrode layer and second layer body second through holes are formed to pass through the fourth electrode layer in the resulting second layer body, and the second layer body through hole passing through the third electrode layer is overlaid on the first layer body through hole passing through the first electrode layer, and the second layer body through hole passing through the fourth electrode layer is overlaid on the first layer body through hole passing through the second electrode layer, and in the step (2), when integrating the first and second layer bodies, the second layer body through hole passing through the third electrode layer is overlaid on the first layer body through hole passing through the first electrode layer, and the second layer through hole passing through the fourth electrode layer is overlaid on the first layer body second through hole passing through the second electrode layer.

17. The method as claimed in claim 13, wherein in the step (1), when forming the first layer body and the second layer body, the layer bodies are each formed with a conductive paste filled in the first layer through holes and the second layer through holes.

* * * * *